United States Patent
Gunn, III et al.

(10) Patent No.: US 6,993,236 B1
(45) Date of Patent: Jan. 31, 2006

(54) POLYSILICON AND SILICON DIOXIDE LIGHT SCATTERERS FOR SILICON WAVEGUIDES ON FIVE LAYER SUBSTRATES

(75) Inventors: Lawrence C. Gunn, III, Encinitas, CA (US); Thierry J. Pinguet, Cardiff-By-The-Sea, CA (US); Maxime Jean Rattier, Paris (FR)

(73) Assignee: Luxtera, Inc., Carlsbad, CA (US)

( * ) Notice: Subject to any disclaimer, the term of this patent is extended or adjusted under 35 U.S.C. 154(b) by 0 days.

(21) Appl. No.: 11/182,262

(22) Filed: Jul. 14, 2005

Related U.S. Application Data

(62) Division of application No. 10/606,297, filed on Jun. 24, 2003.

(60) Provisional application No. 60/391,278, filed on Jun. 24, 2002, provisional application No. 60/393,489, filed on Jul. 3, 2002, provisional application No. 60/393,490, filed on Jul. 3, 2002, provisional application No. 60/393,485, filed on Jul. 3, 2002, provisional application No. 60/393,683, filed on Jul. 3, 2002, provisional application No. 60/393,682, filed on Jul. 3, 2002.

(51) Int. Cl.
    *G02B 6/10* (2006.01)
(52) U.S. Cl. .................... 385/131; 385/129
(58) Field of Classification Search ............ None
    See application file for complete search history.

(56) References Cited

U.S. PATENT DOCUMENTS

| | | |
|---|---|---|
| 5,033,812 A | 7/1991 | Yoshida et al. |
| 5,101,459 A | 3/1992 | Sunagawa |
| 5,132,843 A | 7/1992 | Aoyama et al. |
| 5,367,582 A * | 11/1994 | Magel .................... 385/1 |
| 5,436,991 A | 7/1995 | Sunagawa et al. |
| 5,659,640 A | 8/1997 | Joyner |
| 5,742,433 A | 4/1998 | Shiono et al. |
| 5,917,981 A * | 6/1999 | Kovacic et al. ............. 385/131 |
| 6,285,813 B1 | 9/2001 | Schultz et al. |
| 6,788,847 B2 | 9/2004 | Paddon et al. |
| 2003/0068134 A1 * | 4/2003 | Gunn, III ................... 385/50 |

FOREIGN PATENT DOCUMENTS

| | | | |
|---|---|---|---|
| EP | 0 595 080 | * | 6/1993 |
| JP | 63-106605 | | 5/1988 |
| JP | 2001-4877 | | 1/2001 |

* cited by examiner

*Primary Examiner*—Frank G. Font
*Assistant Examiner*—Christopher M. Kalivoda
(74) *Attorney, Agent, or Firm*—Fernandez & Associates LLP

(57) ABSTRACT

A standard CMOS process is used to fabricate optical, optoelectronic and electronic devices at the same time on a monolithic integrated circuit. FIG. 6 shows a polysilicon and silicon dioxide light scattering element formed on a silicon waveguide. The polysilicon light scatterer is formed on the core of the waveguide with a silicon dioxide layer between the polysilicon and the core. A standard CMOS process is used to form the waveguide and the light scattering element. FIG. 6A is a table summarizing the elements of the light scatterer and the waveguide of FIG. 6 and the CMOS transistors of FIGS. 1 and 2, which are formed from the same materials at the same time on the same substrate. Forming multiple light scatterers on the core of a waveguide can make a grating coupler.

15 Claims, 26 Drawing Sheets

| ELEMENTS OF INTEGRATED COMPONENTS FORMED FROM THE SAME MATERIALS AT THE SAME TIME ||||| 
|---|---|---|---|---|
| TYPICAL MATERIALS | CMOS TRANSISTOR IN FIG. 1 || WAVEGUIDE IN FIGURE 1 ||
|  | # | DESCRIPTION | # | DESCRIPTION |
|  |  |  |  |  |
| SiO2 | 44 | Buried oxide | 44 | Cladding |
| Silicon (45) | 161 | Body of transistor | 151 | Core |
| SiO2 | 1 | Sidewall passivation | 1 | Cladding |
| SiO2 | 15 | Field oxide | 15 | Cladding |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 1A

| ELEMENTS OF INTEGRATED COMPONENTS FORMED FROM THE SAME MATERIALS AT THE SAME TIME |||||
|---|---|---|---|---|
| TYPICAL MATERIALS | CMOS TRANSISTOR IN Figs. 1,2 || WAVEGUIDE IN FIGURE 2 ||
|  | # | DESCRIPTION | # | DESCRIPTION |
|  |  |  |  |  |
| SiO2 | 44 | Buried oxide | 44 | Cladding |
| Silicon (45) | 161 | Body of transistor | 252 | Portion of core |
| SiO2 | 1 | Sidewall passivation | 1 | Cladding |
| SiO2 | 15 | Field oxide | 15 | Cladding |
| SiO2 | 6 | Gate oxide | 6 | Portion of core |
| Poly | 9 | Gate | 9 | Portion of core |
| SiO2 | 7 | Sidewall passivation | 7 | Cladding |
| SiO2 | 8 | Part of gate spacer | 8 | Cladding |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 2A

| ELEMENTS OF INTEGRATED COMPONENTS FORMED FROM THE SAME MATERIALS AT THE SAME TIME ||||| 
|---|---|---|---|---|
| TYPICAL MATERIALS | CMOS TRANSISTOR IN FIG. 1 || WAVEGUIDE IN FIGURE 3 ||
| | # | DESCRIPTION | # | DESCRIPTION |
| | | | | |
| SiO2 | 44 | Buried oxide | 353 | Portion of core |
| Silicon (45) | 161 | Body of transistor | 354 | Portion of core |
| SiO2 | 1 | Sidewall passivation | 1 | Cladding |
| SiO2 | 15 | Field oxide | 15 | Cladding |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 3A

| ELEMENTS OF INTEGRATED COMPONENTS FORMED FROM THE SAME MATERIALS AT THE SAME TIME ||||| 
|---|---|---|---|---|
| TYPICAL MATERIALS | CMOS TRANSISTOR IN FIG. 1 || WAVEGUIDE and LIGHT SCATTERING ELEMENT IN FIGURE 4 ||
|  | # | DESCRIPTION | # | DESCRIPTION |
|  |  |  |  |  |
| SiO2 | 44 | Buried oxide | 44 | Cladding |
| Silicon (45) | 161 | Body of transistor | 451 | Core |
| SiO2 | 1 | Sidewall passivation | 1 | Cladding |
| SiO2 | 15 | Field oxide | 15 | Cladding |
| SiO2 | 6 | Gate oxide | 6 | Part of cladding and light scattering element |
| Poly | 9 | Gate | 9 | " |
| SiO2 | 7 | Sidewall passivation | 7 | " |
| SiO2 | 8 | Part of gate spacer | 8 | " |
| SiO2 | 2 | Oxide spacer | 2 | " |
| Si3N4 | 3 | Salicide block | 3 | " |
| SiO2 | 4 | Contact punch-through | 4 | " |
| SiO2 | 5 | Inter-layer dielectric (ILD) | 5 | " |

FIG. 4A

| ELEMENTS OF INTEGRATED COMPONENTS FORMED FROM THE SAME MATERIALS AT THE SAME TIME | | | | |
|---|---|---|---|---|
| TYPICAL MATERIALS | CMOS TRANSISTOR IN FIG. 1 | | WAVEGUIDE and LIGHT SCATTERING ELEMENTS IN FIGURE 5 | |
| | # | DESCRIPTION | # | DESCRIPTION |
| | | | | |
| SiO2 | 44 | Buried oxide | 44 | Cladding |
| Silicon (45) | 161 | Body of transistor | 451 | Core |
| SiO2 | 1 | Sidewall passivation | 1 | Cladding |
| SiO2 | 15 | Field oxide | 15 | Cladding |
| SiO2 | 6 | Gate oxide | 6 | Part of cladding and light scattering elements |
| Poly | 9 | Gate | 9 | " |
| SiO2 | 7 | Sidewall passivation | 7 | " |
| SiO2 | 8 | Part of gate spacer | 8 | " |
| SiO2 | 2 | Oxide spacer | 2 | " |
| Si3N4 | 3 | Salicide block | 3 | " |
| SiO2 | 4 | Contact punch-through | 4 | " |
| SiO2 | 5 | Inter-layer dielectric (ILD) | 5 | " |

FIG. 5A

| ELEMENTS OF INTEGRATED COMPONENTS FORMED FROM THE SAME MATERIALS AT THE SAME TIME | | | | |
|---|---|---|---|---|
| TYPICAL MATERIALS | CMOS TRANSISTOR IN FIG. 1 | | WAVEGUIDE and LIGHT SCATTERING ELEMENT IN FIGURE 6 | |
| | # | DESCRIPTION | # | DESCRIPTION |
| | | | | |
| SiO2 | 44 | Buried oxide | 653 | Portion of core |
| Silicon (45) | 161 | Body of transistor | 654 | Portion of core |
| SiO2 | 1 | Sidewall passivation | 1 | Cladding |
| SiO2 | 15 | Field oxide | 15 | Cladding |
| SiO2 | 6 | Gate oxide | 6 | Part of cladding and light scattering element |
| Poly | 9 | Gate | 9 | " |
| SiO2 | 7 | Sidewall passivation | 7 | " |
| SiO2 | 8 | Part of gate spacer | 8 | " |
| SiO2 | 2 | Oxide spacer | 2 | " |
| Si3N4 | 3 | Salicide block | 3 | " |
| SiO2 | 4 | Contact punch-through | 4 | " |
| SiO2 | 5 | Inter-layer dielectric (ILD) | 5 | " |

FIG. 6A

| ELEMENTS OF INTEGRATED COMPONENTS FORMED FROM THE SAME MATERIALS AT THE SAME TIME |||||
|---|---|---|---|---|
| TYPICAL MATERIALS | CMOS TRANSISTOR IN FIG. 1 || WAVEGUIDE and LIGHT SCATTERING ELEMENT IN FIGURE 7 ||
| | # | DESCRIPTION | # | DESCRIPTION |
| | | | | |
| SiO2 | 44 | Buried oxide | 44 | Cladding |
| Silicon (45) | 161 | Body of transistor | 751 | Core |
| SiO2 | 1 | Sidewall passivation | 1 | Part of cladding and light scattering element |
| SiO2 | 15 | Field oxide | 15 | " |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 7A

| ELEMENTS OF INTEGRATED COMPONENTS FORMED FROM THE SAME MATERIALS AT THE SAME TIME | | | | |
|---|---|---|---|---|
| TYPICAL MATERIALS | CMOS TRANSISTOR IN FIG. 1 | | WAVEGUIDE and LIGHT SCATTERING ELEMENT IN FIGURE 8 | |
| | # | DESCRIPTION | # | DESCRIPTION |
| | | | | |
| SiO2 | 44 | Buried oxide | 44 | Cladding |
| Silicon (45) | 161 | Body of transistor | 852 | Portion of core |
| SiO2 | 1 | Sidewall passivation | 1 | Cladding |
| SiO2 | 15 | Field oxide | 15 | Cladding |
| SiO2 | 6 | Gate oxide | 6 | Portion of core |
| Poly | 9 | Gate | 9 | Portion of core |
| SiO2 | 7 | Sidewall passivation | 7 | Part of cladding and light scattering element |
| SiO2 | 8 | Part of gate spacer | 8 | " |
| SiO2 | 2 | Oxide spacer | 2 | " |
| Si3N4 | 3 | Salicide block | 3 | " |
| SiO2 | 4 | Contact punch-through | 4 | " |
| SiO2 | 5 | Inter-layer dielectric (ILD) | 5 | " |

FIG. 8A

| ELEMENTS OF INTEGRATED COMPONENTS FORMED FROM THE SAME MATERIALS AT THE SAME TIME | | | | |
|---|---|---|---|---|
| TYPICAL MATERIALS | CMOS TRANSISTOR IN FIG. 1 | | WAVEGUIDE and LIGHT SCATTERING ELEMENT IN FIGURE 9 | |
| | # | DESCRIPTION | # | DESCRIPTION |
| | | | | |
| SiO2 | 44 | Buried oxide | 44 | Cladding |
| Silicon (45) | 161 | Body of transistor | 952 | Portion of core |
| SiO2 | 1 | Sidewall passivation | 1 | Part of cladding and light scattering element |
| SiO2 | 15 | Field oxide | 15 | " |
| SiO2 | 6 | Gate oxide | 6 | Portion of core |
| Poly | 9 | Gate | 9 | Portion of core |
| SiO2 | 7 | Sidewall passivation | 7 | Cladding |
| SiO2 | 8 | Part of gate spacer | 8 | Cladding |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 9A

| ELEMENTS OF INTEGRATED COMPONENTS FORMED FROM THE SAME MATERIALS AT THE SAME TIME |||||
|---|---|---|---|---|
| TYPICAL MATERIALS | CMOS TRANSISTOR IN FIG. 1 || WAVEGUIDE and LIGHT SCATTERING ELEMENT IN FIGURE 10 ||
| | # | DESCRIPTION | # | DESCRIPTION |
| | | | | |
| SiO2 | 44 | Buried oxide | 1053 | Portion of core |
| Silicon (45) | 161 | Body of transistor | 1054 | Portion of core |
| SiO2 | 1 | Sidewall passivation | 1 | Part of cladding and light scattering element |
| SiO2 | 15 | Field oxide | 15 | " |
| SiO2 | 2 | Oxide spacer | 2 | Cladding |
| Si3N4 | 3 | Salicide block | 3 | Cladding |
| SiO2 | 4 | Contact punch-through | 4 | Cladding |
| SiO2 | 5 | Inter-layer dielectric (ILD) | 5 | Cladding |

FIG. 10A

| \multicolumn{5}{c}{ELEMENTS OF INTEGRATED COMPONENTS FORMED FROM THE SAME MATERIALS AT THE SAME TIME} | | | | |
|---|---|---|---|---|
| TYPICAL MATERIALS | CMOS TRANSISTOR IN FIG. 1 | | ACTIVE WAVEGUIDE IN FIG. 11 | |
|  | # | DESCRIPTION | # | DESCRIPTION |
|  |  |  |  |  |
| SiO2 | 44 | Buried oxide | 44 | Cladding |
| Silicon (45) | 161 | Body of transistor | 1182 | Portion of core |
| Dopant | 161 | Well implant into body | 1182 | Implant into silicon of core |
| SiO2 | 1 | Sidewall passivation | 1 | Cladding |
| SiO2 | 15 | Field oxide | 15 | Cladding |
| SiO2 | 6 | Gate oxide | 6 | Portion of core |
| Poly | 9 | Gate | 9 | Portion of core |
| SiO2 | 7 | Sidewall passivation | 7 | Cladding |
| SiO2 | 8 | Part of gate spacer | 8 | Cladding |
| Dopant | 16 | Extension implants | 16 | Extension implants |
| SiO2 | 2 | Oxide spacer | 2 | Cladding |
| Si3N4 | 3 | Salicide block | 3 | Cladding |
| Dopant | 17 | S, D and G implants | 17 | S and D implants |
| Cobalt silicide | 18 | S, D and G contacts | 18 | S and D contacts |
| SiO2 | 4 | Contact punch-through | 4 | Cladding |
| Tungsten | 19 | Conductive plugs | 19 | Conductive plugs |
| SiO2 | 5 | Inter-layer dielectric (ILD) | 5 | Cladding |

FIG. 11A

| ELEMENTS OF INTEGRATED COMPONENTS FORMED FROM THE SAME MATERIALS AT THE SAME TIME ||||||
| --- | --- | --- | --- | --- | --- |
| TYPICAL MATERIALS | CMOS TRANSISTOR IN FIG. 1 || ACTIVE WAVEGUIDE IN FIG. 12 ||
| | # | DESCRIPTION | # | DESCRIPTION |
| | | | | |
| SiO2 | 44 | Insulator | 1293 | Portion of core |
| Silicon (45) | 161 | Body of transistor | 1294 | Portion of core |
| Dopant | 161 | Well implant into body | 1292 | Implant into silicon of core |
| SiO2 | 1 | Sidewall passivation | 1 | Cladding |
| SiO2 | 15 | Field oxide | 15 | Cladding |
| SiO2 | 2 | Oxide spacer | 2 | Cladding |
| Si3N4 | 3 | Salicide block | 3 | Cladding |
| Dopant | 17 | S, D and G implants | 17 | S and D implants |
| Cobalt silicide | 18 | S, D and G contacts | 18 | S and D contacts |
| SiO2 | 4 | Contact punch-through | 4 | Cladding |
| Tungsten | 19 | Conductive plugs | 19 | Conductive plugs |
| SiO2 | 5 | Inter-layer dielectric (ILD) | 5 | Cladding |

FIG. 12A

POLYSILICON AND SILICON DIOXIDE LIGHT SCATTERERS FOR SILICON WAVEGUIDES ON FIVE LAYER SUBSTRATES

CROSS-REFERENCE TO RELATED APPLICATIONS

Division of application Ser. No. 10/606,297 filed on Jun. 24, 2003, which claims priority from U.S. Provisional applications No. 60/391,278 filed Jun. 24, 2002, 60/393,489 filed Jul. 3, 2002, 60/393,490 filed Jul. 3, 2002, 60/393,485 filed Jul. 3, 2002, 60/393,683 filed Jul. 3, 2002 and 60/393,682 filed Jul. 3, 2002.

FIELD OF THE INVENTION

The present invention relates to a method for the production of optical, optoelectronic and electronic devices on the same monolithic integrated circuit.

BACKGROUND OF THE INVENTION

The rapid expansion in the use of the Internet has resulted in a demand for high speed communications links and devices, including optical links and devices. Optical links using fiber optics have many advantages compared to electrical links: large bandwidth, high noise immunity, reduced power dissipation and minimal crosstalk. Optoelectronic integrated circuits made of silicon are highly desirable since they could be fabricated in the same foundries used to make VLSI integrated circuits. Optical devices integrated with their associated electronic circuits can eliminate the need for more expensive hybrid optoelectronic circuits. Optical devices built using a standard CMOS process are very desirable for many reasons: high yields, low fabrication costs and continuous process improvements.

SUMMARY OF THE INVENTION

A standard CMOS process is used to fabricate optical, optoelectronic and electronic devices at the same time on a monolithic integrated circuit. FIG. 6 shows a polysilicon and silicon dioxide light scattering element formed on a silicon waveguide. The polysilicon light scatterer is formed on the core of the waveguide with a silicon dioxide layer between the polysilicon and the core. A standard CMOS process is used to form the waveguide and the light scattering element. FIG. 6A is a table summarizing the elements of the light scatterer and the waveguide of FIG. 6 and the CMOS transistors of FIGS. 1 and 2, which are formed from the same materials at the same time on the same substrate. Forming multiple light scatterers on the core of a waveguide can make a grating coupler. In a standard CMOS process, a layer of metallic salicide can be deposited on those selected portions of an integrated circuit, where it is desired to have metallic contacts for electronic components, such as transistors. The deposition of a salicide into optical elements such as the core of an optical waveguide or a light scatterer will damage the elements and prevent the passage of light through those sections of the elements. Prior to the deposition of the salicide, a salicide blocking layer is deposited on those parts of an integrated circuit, such as on an optical waveguide or a light scatterer, which are to be protected from damage by the deposition of salicide. The salicide blocking layer is used as one layer of the cladding of a silicon waveguide and a light scatterer.

BRIEF DESCRIPTION OF THE DRAWINGS

FIG. 1A is a table summarizing the elements of the waveguide and the CMOS transistor of FIG. 1, which are formed from the same materials at the same time on the same substrate.

FIG. 2A is a table summarizing the elements of the waveguide of FIG. 2 and the CMOS transistors of FIGS. 1 and 2, which are formed from the same materials at the same time on the same substrate.

FIG. 3A is a table summarizing the elements of the waveguide of FIG. 3 and the CMOS transistor of FIGS. 1 and 2, which are formed from the same materials at the same time on the same substrate.

FIG. 4A is a table summarizing the elements of the waveguide and the light scattering element of FIG. 4 and the CMOS transistor of FIGS. 1 and 2, which are formed from the same materials at the same time on the same substrate.

FIG. 5A is a table summarizing the elements of the waveguide and the multiple light scattering elements of FIG. 5 and the CMOS transistor of FIGS. 1 and 2, which are formed from the same materials at the same time on the same substrate.

FIG. 6A is a table summarizing the elements of the waveguide and the light scattering element of FIG. 6 and the CMOS transistor of FIGS. 1 and 2, which are formed from the same materials at the same time on the same substrate.

FIG. 7A is a table summarizing the elements of the waveguide and the light scattering element of FIG. 7 and the CMOS transistor of FIGS. 1 and 2, which are formed from the same materials at the same time on the same substrate.

FIG. 8A is a table summarizing the elements of the waveguide and the light scattering element of FIG. 8 and the CMOS transistor of FIGS. 1 and 2, which are formed from the same materials at the same time on the same substrate.

FIG. 9A is a table summarizing the elements of the waveguide and the light scattering element of FIG. 9 and the CMOS transistor of FIGS. 1 and 2, which are formed from the same materials at the same time on the same substrate.

FIG. 10A is a table summarizing the elements of the waveguide and the light scattering element of FIG. 10 and the CMOS transistor of FIGS. 1 and 2, which are formed from the same materials at the same time on the same substrate.

FIG. 11A is a table summarizing the elements of the active waveguide of FIG. 11 and the CMOS transistor of FIGS. 1 and 2, which are formed from the same materials at the same time on the same substrate.

FIG. 12A is a table summarizing the elements of the active waveguide of FIG. 12 and the CMOS transistor of FIGS. 1 and 2, which are formed from the same materials at the same time on the same substrate.

DETAILED DESCRIPTION

Figure 1:
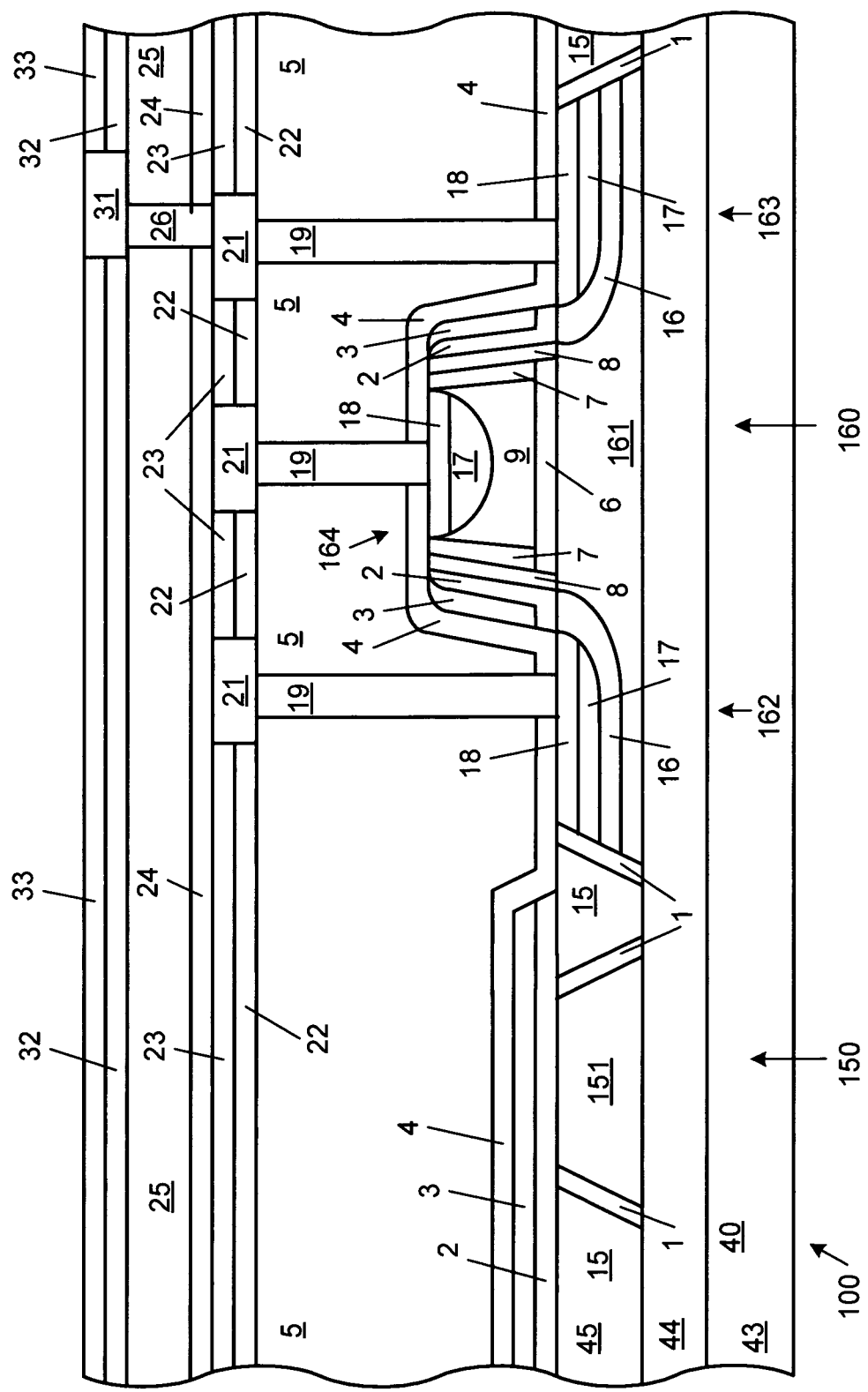
FIG. 1 is a cross sectional view of a waveguide and a CMOS transistor, according to one embodiment of the present invention.

FIG. 1 is a cross sectional view, not to scale, of waveguide 150 and CMOS transistor 160, according to one embodiment of the present invention. Optical waveguide 150 and CMOS transistor 160 are part of integrated circuit 100, which has been fabricated on substrate 40. Substrate 40 is made of dielectric layer 44, which is frequently referred to as buried oxide (BOX), and silicon layer 43. Dielectric layer 44 typically consists of silicon dioxide. On top of silicon dioxide layer 44 is silicon layer 45. Layers 45, 44 and 43 together form what is commonly referred to as a SOI (silicon on insulator) wafer, which is frequently used for the production of CMOS integrated circuits. Waveguide 150 can be referred to as a channel waveguide formed on substrate 40.

Waveguide 150 is made of silicon core 151 and surrounding layers of cladding. Silicon core 151 in a cross sectional view can have one of many possible shapes, such as those of a square, a rectangle, a trapezoid or other form. Silicon dioxide layer 44 functions as a bottom cladding for core 151. Surrounding waveguide core 151 on both sides of it are layers of sidewall passivation 1 and sections of field oxide 15, which serve as side claddings. Field oxide 15 is frequently referred to as FOX. Sidewall passivation layers 1 are made of dielectric material, and typically consist of silicon dioxide. Sidewall passivation made of silicon dioxide is typically formed by the thermal oxidation of silicon. Sections of field oxide 15 are made of dielectric material, and typically consist of silicon dioxide.

On top of silicon core 151 are dielectric layers 2, 3, 4 and 5, which function as top cladding. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material. An ILD like layer 5 was historically made of silicon dioxide, but now is more typically made of a low k dielectric, such as silicon carbon oxide.

Those skilled in the art of the fabrication of integrated circuits can use any of a variety of well known processing methods and techniques to form the elements and layers, such as: thermal growth of oxide layers, PECVD, TEOS and others.

CMOS transistor 160 is made of many layers and elements, which form three sections: source 162, drain 163 and gate 164. The source 162 and the drain 163 are formed in the silicon body 161 of transistor 160. The sides of silicon body 161 are covered by layers of sidewall passivation 1. The gate 164 is made of many layers and elements formed on top of silicon body 161. Gate oxide layer 6 is formed on top of silicon body 161. On top of gate oxide 6, polysilicon gate structure 9 is formed. The sides of polysilicon gate 9 are covered by sidewall passivation layers 7 and dielectric layers 8. Gate oxide layer 6 and dielectric spacer 8 are typically made of silicon dioxide.

Silicon body 161 of transistor 160 can typically contain a well implant, which can be positively or negatively doped. Into two regions of silicon body 161 are placed extension implants 16. Source and drain implants 17 are also made into silicon body 161. The implants 16 and 17 are typically oppositely doped to the polarity of the well implant in silicon body 161. Gate implant 17 is also made into polysilicon gate 9. A gate spacer for the polysilicon gate 9 is typically made of layers 8, 2 and 3. Layer 2 is an oxide spacer layer, typically made of silicon dioxide. Layer 3 is a salicide blocking layer, typically made of silicon nitride. Masking layers are designed to exclude implants from waveguide 150.

Ohmic contacts 18, typically of cobalt silicide, are made into the doped regions of transistor 160. After the ohmic contacts 18 have been formed, then layer 4, which is a contact punch-through layer, can be deposited. On top of layer 4, layer 5 is deposited. Layer 5 is an inter-level dielectric (ILD), which can be made of multiple layers of dielectric material. Coming through layers 4 and 5 are conductive plugs 19, typically made of tungsten, which connect ohmic contacts 18 to the first metal layer 21.

First metal layer 21 (M1) is typically made of copper and connects to the conductive plugs 19 from the transistor and provides electrical connections to other circuits on the integrated circuit 100. Insulating the metal segments from each other in first metal layer 21 are layers 22 and 23. Layer 22 is a contact punch-through layer made of dielectric material. Layer 23 is an inter-layer dielectric (ILD) spacer layer made of dielectric material, typically silicon dioxide or silicon carbon oxide.

Layers 24 and 25 are inter-level dielectrics (ILD) separating the first metal layer 21 from the second metal layer (M2) 31. Layer 24 is a contact punch-through layer made of dielectric material. Layer 25 is an inter-layer dielectric, which can be made of multiple layers of dielectric.

First metal layer 21 is connected to second metal layer 31 by via 26 made of metal, typically copper or aluminum. The metal segments in layer 31 are separated from each other by dielectric layers 32 and 33. Layer 32 is a contact punch-through layer, made of dielectric material. Layer 33 is an inter-layer dielectric (ILD) spacer layer, made of dielectric material. FIG. 1 does not show any other metal layers, which provide other electrical interconnection pathways between the devices on an integrated circuit and which would be on top of the two metal layers shown.

The dielectric materials used in the fabrication of the waveguide can include many dielectric elements used in the fabrication of a CMOS transistor, such as: an inter-layer dielectric film, a gate spacer, a salicide block, a dielectric spacer, a passivation film, an isolation dielectric and a field oxide.

The dielectric materials used to make a waveguide and a CMOS transistor can include the following: $SiO_2$, SiCOH, SiCOF, $Si_3N_4$, SiON, BPSG, TEOS and silicon-based materials including one or more of the following elements: oxygen, carbon, nitrogen, hydrogen, boron, phosphorus, fluorine and arsenic.

SOI (silicon on insulator) wafers, such as one made of layers 45, 44 and 43, are frequently used for the production of CMOS integrated circuits. Many parts or elements of waveguide 150 and CMOS transistor 160 are made of the same materials and can be made at the same time during the fabrication of a monolithic CMOS integrated circuit.

FIG. 1A is a table summarizing the elements of waveguide 150 and the transistor 160 of FIG. 1, which are formed from the same materials at the same time on the same substrate.

Silicon layer 45 is used to form the silicon core 151 of waveguide 150 and the silicon body 161 of CMOS transistor 160. The fabrication of these silicon elements can be done at the same time during the fabrication of a monolithic CMOS integrated circuit.

Sidewall passivation layers 1 of waveguide 150 and sidewall passivation layers 1 of transistor 160 can be formed at the same time of the same dielectric material on the same substrate.

Field oxide 15, which surrounds waveguide 150 and CMOS transistor 160 can be formed at the same time from the same dielectric material on the same substrate.

Dielectric layers 2, 3, 4 and 5 can be used to form the cladding for waveguide 150 and the dielectric elements of CMOS transistor 160 of the same dielectric materials at the same time on the same substrate.

One particularly advantageous aspect of the present invention is the use of salicide blocking layer 3, which is part of the standard CMOS process, as an element of the cladding of waveguide 150. Ohmic contacts are typically used to make electrical connections with any devices or components, which have been fabricated on an integrated circuit. Ohmic contacts are formed by depositing metallic cobalt silicide on those parts of an integrated circuit, where it is desired to have metallic contact regions. Salicide blocking layer 3 is deposited on those parts of an integrated circuit, where it is necessary to prevent the deposition of cobalt silicide in subsequent process steps.

If cobalt silicide were deposited into the core of an optical waveguide, light would not be able to pass through that section of the waveguide. Thus, salicide blocking layer 3 is used to protect the core of an optical waveguide from the light blocking deposition of metallic cobalt salicide.

A particularly advantageous aspect of the present invention is the fabrication of the elements of waveguide and the elements of a CMOS transistor at the same time and using the same materials on the same substrate, using standard CMOS processing steps.

Figure 2:
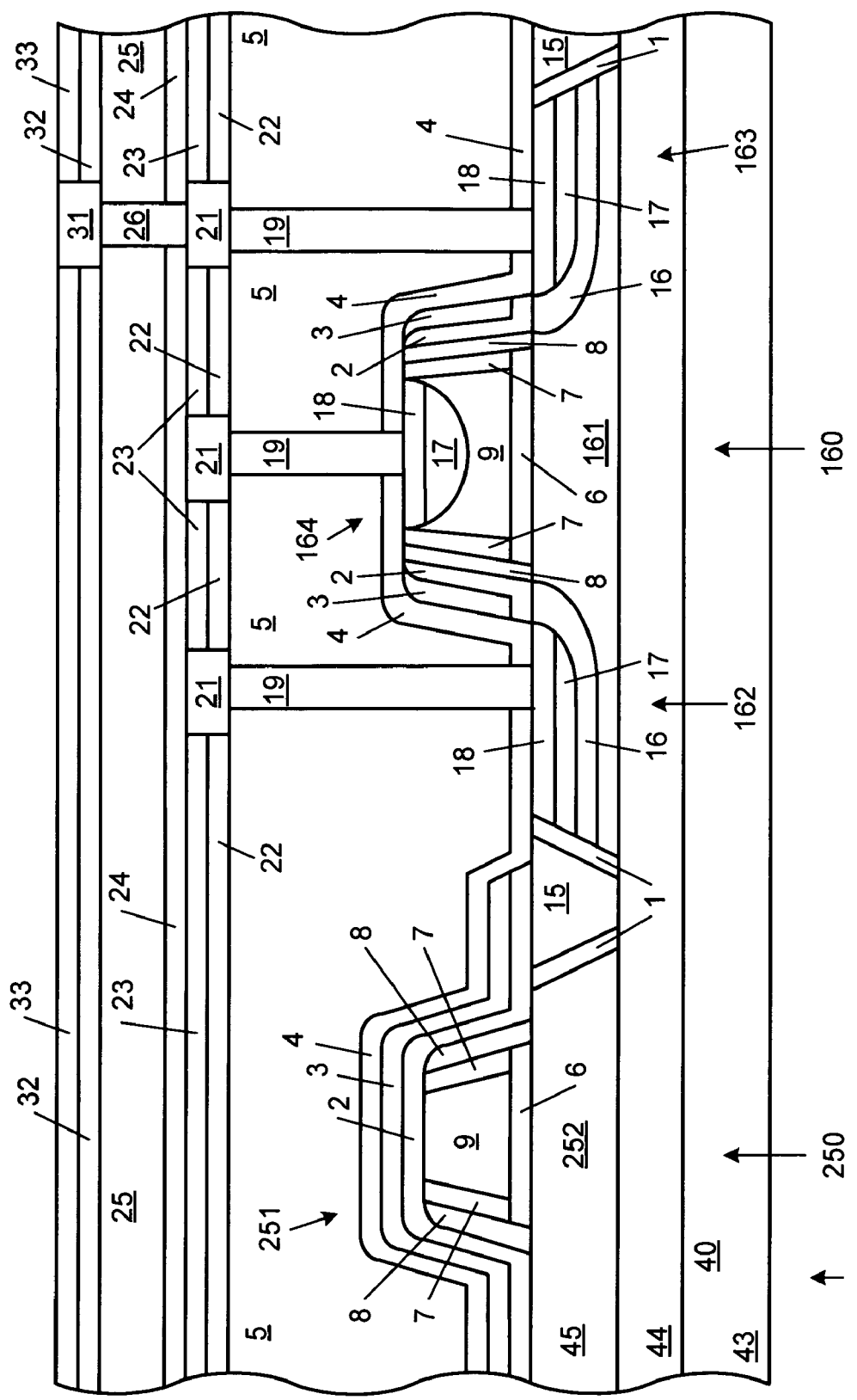
FIG. 2 is a cross sectional view of a strip loaded waveguide and a CMOS transistor, according to one embodiment of the present invention.

FIG. 2 is a cross sectional view, not to scale, of strip loaded waveguide 250 and CMOS transistor 160, according to one embodiment of the present invention. All references to CMOS transistor 160 herein are with respect to the CMOS transistor shown in FIGS. 1 and 2. Optical waveguide 250 and CMOS transistor 160 are part of integrated circuit 200, which has been fabricated on substrate 40. Substrate 40 is made of dielectric layer 44, which is typically silicon dioxide and silicon layer 43. On top of silicon dioxide layer 44 is silicon layer 45. Layers 45, 44 and 43 together form what is commonly referred to as a SOI (silicon on insulator) wafer, which is typically used for the production of CMOS integrated circuits.

Waveguide 250 is made of core 251 and surrounding layers of cladding. The core 251 is made of silicon slab 252, dielectric layer 6 and polysilicon strip 9. Dielectric layer 6 is typically made of silicon dioxide. Silicon dioxide layer 44 functions as a bottom cladding for core 251.

On the side of silicon slab 252 is a layer of sidewall passivation 1 and a section of field oxide 15, which serve as side claddings. Sidewall passivation layer 1 is made of dielectric material, typically silicon dioxide. Sidewall passivation can be formed by the thermal oxidation of silicon. Sections of field oxide 15 are made of dielectric material, typically silicon dioxide. On top of core 251 are dielectric layers 2, 3, 4 and 5, which function as top cladding. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material.

CMOS transistor 160 in FIG. 2 is very similar to CMOS transistor 160 shown in FIG. 1 and as previously described herein. The dielectric materials listed with respect to FIG. 1 are all usable as dielectric materials for the devices shown in FIG. 2.

SOI (silicon on insulator) wafers, such as one made of layers 45, 44 and 43, are frequently used for the production of CMOS integrated circuits. Many parts or elements of waveguide 250 and the CMOS transistor 160 are made of the same materials and can be made at the same time during the fabrication of a monolithic CMOS integrated circuit.

FIG. 2A is a table summarizing the elements of waveguide 250 and the CMOS transistor 160 of FIGS. 1 and 2, which are formed from the same materials at the same time on the same substrate.

Silicon layer 45 is used to form silicon slab 252 of waveguide 250 and the silicon body 161 of CMOS transistor 160. These silicon elements can be formed of the same material at the same time during the fabrication of a monolithic CMOS integrated circuit.

Sidewall passivation layer 1 of waveguide 250 and sidewall passivation layers 1 of CMOS transistor 160 can be formed at the same time of the same dielectric material on the same substrate.

Field oxide 15, which surrounds waveguide 250 and CMOS transistor 160 can be formed at the same time from the same dielectric material on the same substrate.

Dielectric layer 6 of waveguide 250 and the gate oxide 6 of CMOS transistor 160 can be formed at the same time of the same dielectric material on the same substrate.

Polysilicon strip 9 of waveguide 250 and the polysilicon gate 9 of CMOS transistor 160 can be formed at the same time of the same dielectric material on the same substrate.

Sidewall passivation layers 7 of waveguide 250 and sidewall passivation layers 7 of CMOS transistor 160 can be formed at the same time from the same dielectric material on the same substrate.

Dielectric layers 8 of waveguide 250 and the dielectric layers 8 of CMOS transistor 160 can be formed at the same time from the same dielectric material on the same substrate.

Dielectric layers 2, 3, 4 and 5 used to form the cladding for the waveguide 250 and dielectric layers 2, 3, 4 and 5 of CMOS transistor 160 can be formed at the same time of the same dielectric materials on the same substrate.

One particularly advantageous aspect of the present invention is the use of salicide blocking layer 3, which is part of the standard CMOS process, as one of the layers of the cladding of waveguide 250. Salicide blocking layer 3 is an essential layer in the CMOS process of forming the ohmic contacts needed to make electrical connections to transistor 160. Salicide blocking layer 3 prevents the deposition of cobalt silicide in any part of a CMOS integrated circuit, where it is not needed. If cobalt silicide is deposited into the core of optical waveguide 250, light will not be able to pass through that section of the waveguide. Thus, salicide blocking layer 3 is essential to protecting the core of optical waveguide 250 from the light blocking deposition of metallic cobalt salicide.

In an alternate embodiment of the present invention, waveguide 250 is fabricated without dielectric layer 6, where the polysilicon strip 9 is formed on top of waveguide core 251.

A particularly advantageous aspect of the present invention is the fabrication of the elements of waveguide 250 and the elements of CMOS transistor 160 at the same time and using the same materials on the same substrate, using standard CMOS processing steps.

Figure 3:
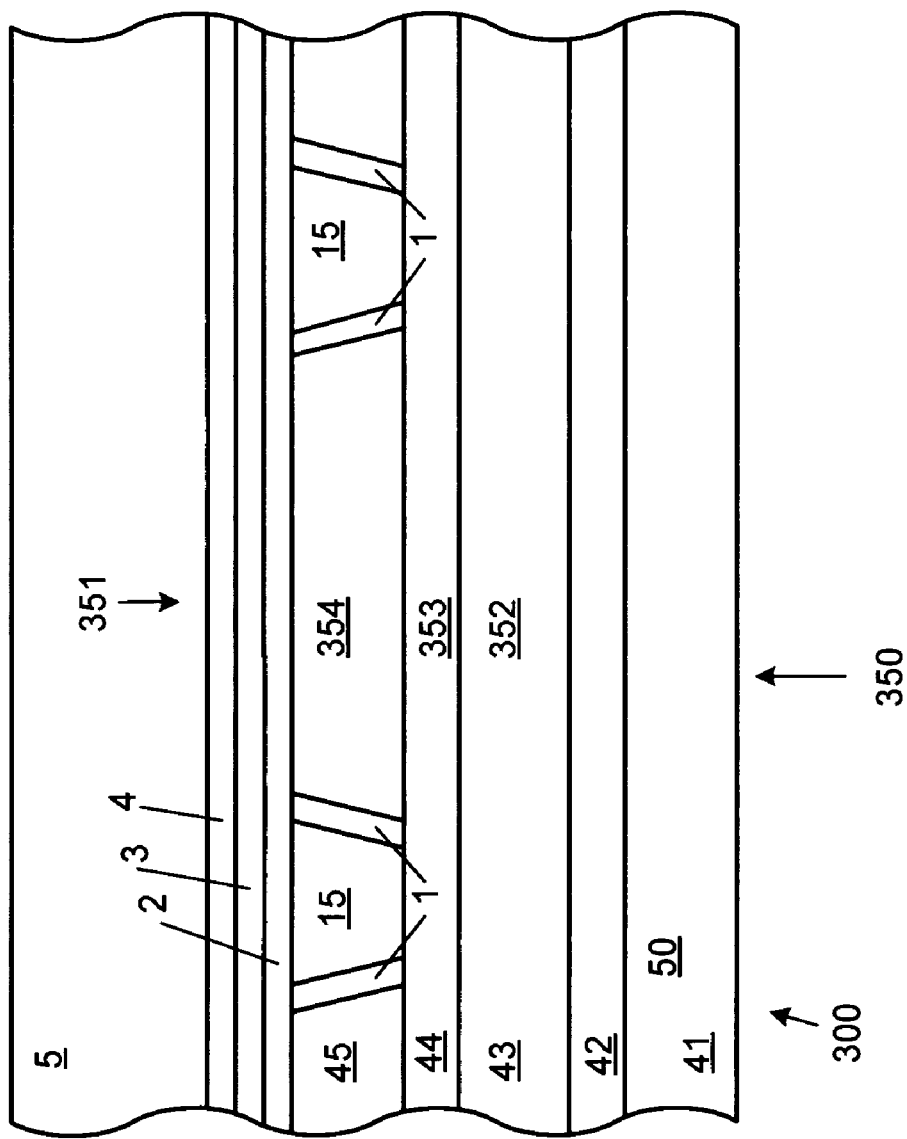
FIG. 3 is a cross sectional view of a strip loaded waveguide, according to another embodiment of the present invention.

FIG. 3 is a cross sectional view, not to scale, of strip loaded waveguide 350, according to another embodiment of the present invention. Optical waveguide 350 is part of integrated circuit 300, which has been fabricated on substrate 50. Substrate 50 is made of dielectric layer 44, which is typically made of silicon dioxide, silicon layer 43, silicon dioxide layer 42 and silicon layer 41. On top of silicon dioxide layer 44 is silicon layer 45. Layers 45, 44, 43, 42 and 41 together form a wafer, and integrated optical and electronic devices can be formed on such a wafer using standard CMOS processes.

Waveguide 350 is made of core 351 and surrounding layers of cladding. Core 351 is made of silicon strip 354, dielectric layer 353 and silicon slab 352. Silicon strip 354 is formed from silicon layer 45. Dielectric layer 353 is formed from dielectric layer 44. Silicon slab 352 is formed from silicon layer 43. Silicon dioxide layer 42 functions as a bottom cladding for core 351. Surrounding silicon strip 354 on both sides of it are layers of sidewall passivation 1 and sections of field oxide 15, which serve as side cladding. Sidewall passivation layers 1 are made of dielectric material, typically silicon dioxide. Sidewall passivation can be formed by the thermal oxidation of silicon. Field oxide 15 is made of dielectric material, typically silicon dioxide.

On top of core 351 are dielectric layers 2, 3, 4 and 5, which function as a top cladding. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material.

Waveguide 350 and CMOS transistor 160, like the one discussed in detail with respect to FIG. 1, can be fabricated on the same monolithic integrated circuit, in a manner similar to the way in which waveguide 150 and CMOS transistor 160 in FIG. 1 were fabricated.

The dielectric materials listed with respect to FIG. 1 are all usable as dielectric materials for waveguide 350 shown in FIG. 3.

FIG. 3A is a table summarizing the elements of waveguide 350 of FIG. 3 and the CMOS transistor 160, which are formed from the same materials at the same time on the same substrate.

Silicon layer 45 is used to form silicon strip 354 of waveguide 350 and the silicon body 161 of CMOS transistor 160. The fabrication of these silicon elements can be done at the same time during the fabrication of a monolithic CMOS integrated circuit.

Sidewall passivation layers 1 of waveguide 350 and the sidewall passivation layers for the silicon body of CMOS transistor 160 can be formed at the same time of the same dielectric material on the same substrate.

Field oxide 15 surrounding silicon strip 354 and the field oxide surrounding the body of CMOS transistor 160 can be formed at the same time from the same dielectric material on the same substrate.

Dielectric layers 2, 3, 4 and 5, used to form the cladding for waveguide 350 and dielectric layers 2, 3, 4 and 5 of CMOS transistor 160 can be formed at the same time of the same dielectric materials on the same substrate.

In an alternate embodiment of the present invention, waveguide 350 is fabricated as a strip loaded waveguide with a dielectric layer on top of the waveguide core and with a polysilicon strip on the dielectric layer.

In another alternate embodiment of the present invention, waveguide 350 is fabricated as a strip loaded waveguide with a polysilicon strip on the waveguide core.

One particularly advantageous aspect of the present invention is the use of salicide blocking layer 3, which is part of the standard CMOS process, as an element of the cladding of waveguide 350. Salicide blocking layer 3 is an essential layer in the CMOS process of forming the ohmic contacts needed to make electrical connections to CMOS transistor 160. Salicide blocking layer 3 prevents the deposition of cobalt silicide in any part of a CMOS integrated circuit, where it is not needed. If cobalt silicide is deposited into the core of optical waveguide 350, light will not be able to pass through that section of the waveguide. Thus, salicide blocking layer 3 is essential to protecting the core of optical waveguide 350 from the light blocking deposition of metallic cobalt silicide.

A particularly advantageous aspect of the present invention is the fabrication of the elements of waveguide 350 and the elements of CMOS transistor 160 at the same time and using the same materials on the same substrate, using standard CMOS processing steps.

Figure 4:
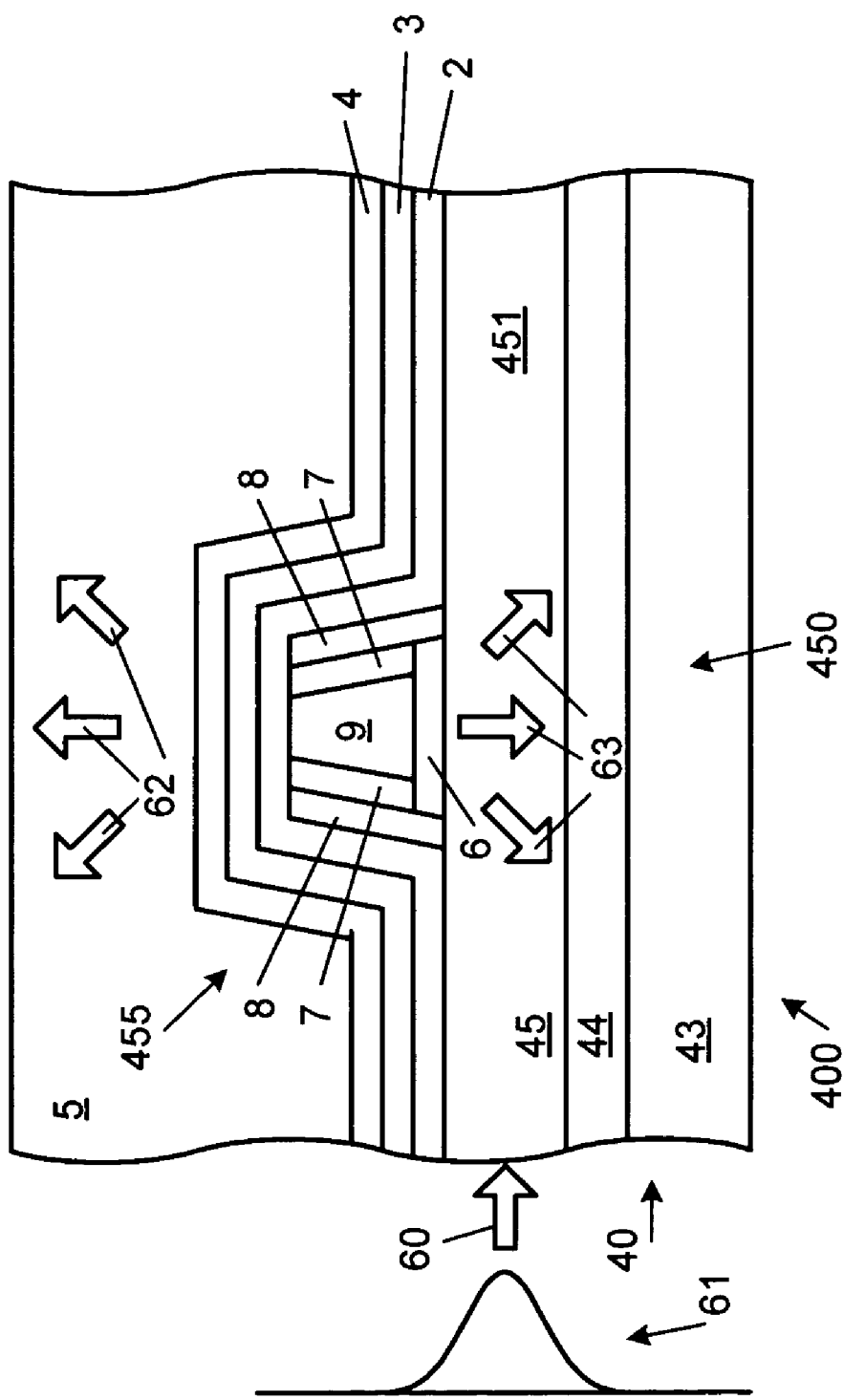
FIG. 4 is a side view of a waveguide with a light scattering element, according to one embodiment of the present invention.

FIG. 4 is a side view, not to scale, of waveguide 450 with light scattering element 455, according to one embodiment of the present invention. Optical waveguide 450 and light scattering element 455 are part of integrated circuit 400, which has been fabricated on substrate 40. Substrate 40 is made of dielectric layer 44, which is typically made of silicon dioxide and silicon layer 43. On top of silicon dioxide layer 44 is silicon layer 45. Layers 45, 44 and 43 together form what is commonly referred to as a SOI (silicon on insulator) wafer, which is frequently used for the production of CMOS integrated circuits.

Waveguide 450 is made of silicon core 451 and surrounding layers of cladding. Silicon core 451 in a cross sectional view can have one of many possible shapes, such as those of a square, a rectangle, a trapezoid or other form. Silicon dioxide layer 44 functions as a bottom cladding for core 451. Sidewall passivation layers and sections of field oxide, not shown in FIG. 4, are made of dielectric materials and provide side cladding for waveguide core 451. Sidewall passivation can be formed by the thermal oxidation of silicon.

Light scattering element 455 is disposed on top of silicon core 451. Light scattering element 455 includes dielectric layer 6, polysilicon structure 9, sidewall passivation layers 7, dielectric layers 8 and surrounding cladding. Dielectric layer 6, sidewall passivation layer 7 and dielectric layer 8 are typically made of silicon dioxide.

Polysilicon structure 9 in a cross sectional view can have one of many possible shapes, such as those of a square, a rectangle, a trapezoid or other form. The design of polysilicon structure 9, including its size and shape is dependent on the requirements of a particular application and is well known to those skilled in the art.

On top of waveguide core 451 and light scattering element 455 are dielectric layers 2, 3, 4 and 5, which provide top cladding for waveguide core 451 and top and side cladding for light scattering element 455. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material. ILD layer 5 can be made of silicon dioxide or preferably, a low k dielectric, such as silicon carbon oxide.

Light 60 propagating through waveguide core 451 will be mainly confined to the core 451, primarily in a single mode, due to the large difference in refractive indices between silicon core 451 and the surrounding claddings. The single mode distribution of light propagating in core 451 is shown by graph 61, which shows that the peak power level of the light in waveguide 450 is primarily near to the center of core 451. Graph 61 is an approximate illustration of the distribution of power in waveguide 450. Silicon core 451 has a refractive index (n) of approximately 3.5 as compared to a refractive index of about 1.5 for silicon dioxide, which is the primary material of the claddings.

As light 60 travels through waveguide 450, it is primarily confined near to the center of core 451, but some of the light propagates through the cladding on top of core 451. When the light in the top cladding reaches the boundary with polysilicon structure 9 in light scattering element 455, some of the light is scattered downward as shown by arrows 63 and some of the light is scattered upward as shown by arrows 62. The scattering of light 60 by light scattering element 455 is primarily due to the abrupt change in refractive index at the boundary between the top cladding and polysilicon 9. Top cladding layers 2, 3 and 4 are typically made of silicon dioxide, which has a refractive index of about 1.5. Polysilicon 9 has a refractive index of about 3.6. Light scattering element 455 provides an optical coupling between the core 451 and the layers above and below the core 451.

Light can also travel in the opposite direction through light scattering element 455, so that light, which is traveling down from a higher level can be coupled into the core 451 of waveguide 450 by light scattering element 455.

Forming multiple light scattering elements 455 on top of the core 451 of waveguide 4.50 can make an optical device, such as a grating coupler. Designing such a grating coupler will require, among other things, determining the number, shape, size and spacing of the light scattering elements 455 and such design is well known to those skilled in the art.

A typical integrated circuit 400 will have several metal layers above the dielectric layers 5 to provide for interconnections between the components fabricated on the same substrate, but these layers are not shown in FIG. 4. For light to be scattered up out of waveguide 450 or for light to be coupled into waveguide 450 from above, there cannot be any segments or pieces of any metal layers directly above light scattering element 455.

Many parts of light scattering element 455 of FIG. 4 and CMOS transistor 160 are made of the same materials and can be made at the same time during the fabrication of a monolithic CMOS integrated circuit.

FIG. 4A is a table summarizing the parts of waveguide 450 and the light scattering element 455 of FIG. 4 and the CMOS transistor 160, which are formed from the same materials at the same time on the same substrate.

Silicon layer 45 is used to form silicon core 451 of waveguide 450 and the silicon body 161 of CMOS transistor 160. These silicon elements can be formed of the same material at the same time during the fabrication of a monolithic CMOS integrated circuit.

Sidewall passivation layers, not shown in FIG. 4, on the sides of waveguide core 451 and the sidewall passivation layers 1 for the silicon body of CMOS transistor 160 can be formed at the same time of the same dielectric material on the same substrate.

Field oxide sections, not shown in FIG. 4, on the sides of silicon core 451 and the field oxide 15 surrounding the body of CMOS transistor 160 can be formed at the same time from the same dielectric material on the same substrate.

Dielectric layer 6 of light scattering element 455 and the gate oxide 6 of CMOS transistor 160 can be formed at the same time of the same dielectric material on the same substrate.

Polysilicon strip 9 of light scattering element 455 and the polysilicon gate 9 of CMOS transistor 160 can be formed at the same time of the same dielectric material on the same substrate.

Sidewall passivation layers 7 of light scattering element 455 and sidewall passivation layers 7 of CMOS transistor 160 can be formed at the same time from the same dielectric material on the same substrate.

Dielectric layers 8 of light scattering element 455 and the dielectric layers 8 of CMOS transistor 160 can be formed at the same time from the same dielectric material on the same substrate.

Dielectric layers 2, 3, 4 and 5 used to form the cladding for waveguide 450 and the light scattering element 455 and dielectric layers 2, 3, 4 and 5 of CMOS transistor 160 can be formed at the same time of the same dielectric materials on the same substrate.

In alternate embodiments of the present invention, light scattering element 455 is fabricated without dielectric layer 6, where the polysilicon strip 9 is on top of waveguide core 451.

One particularly advantageous aspect of the present invention is the use of salicide blocking layer 3, which is part of the standard CMOS process, as an element of the cladding for the waveguide 450 and the light scattering element 455. Salicide blocking layer 3 is an essential layer in the CMOS process of forming the ohmic contacts needed to make electrical connections to transistor 160. Salicide blocking layer 3 prevents the deposition of cobalt silicide in any part of a CMOS integrated circuit, where it is not needed. If cobalt silicide is deposited into the core of optical waveguide 450, light will not be able to pass through that section of the waveguide. Thus, salicide blocking layer 3 is essential to protecting the core 451 of optical waveguide 450 from the light blocking deposition of metallic cobalt silicide.

A particularly advantageous aspect of the present invention is the fabrication of the parts of light scattering element 455 and the parts of CMOS transistor 160 at the same time and using the same materials on the same substrate, during standard CMOS processing steps.

Figure 5:
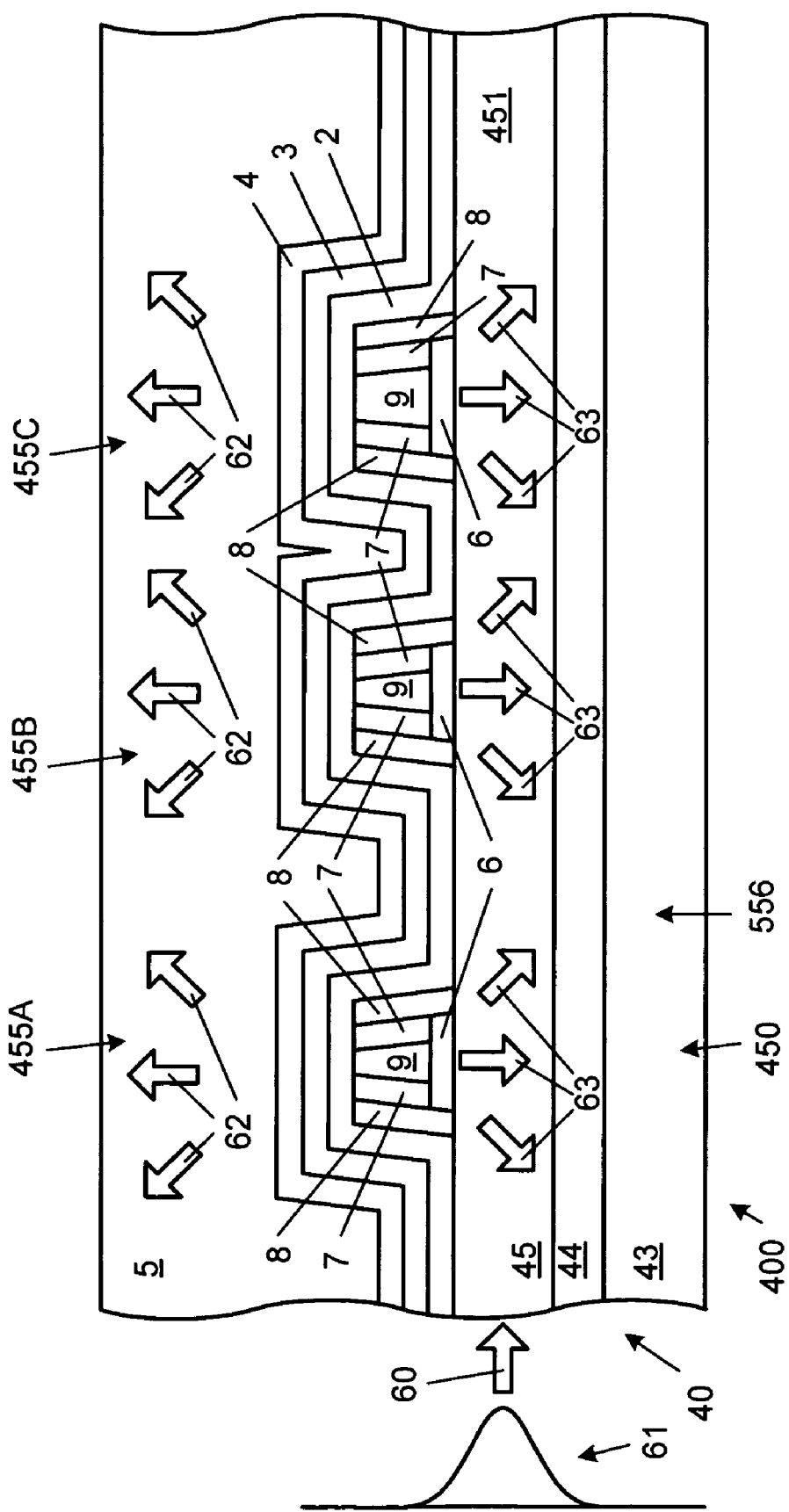
FIG. 5 is a side view of a waveguide with multiple light scattering elements, according to one embodiment of the present invention.

FIG. 5 is a side view, not to scale, of waveguide 450 and multiple light scattering elements 556, according to one embodiment of the present invention. FIG. 5 includes optical waveguide 450 and light scattering elements 556, which are part of integrated circuit 400, and has been fabricated on substrate 40. Light scattering elements 556 are made of as many individual elements 455A, 455B, 455C, etc. as may be needed for a particular application, but only three are shown in FIG. 5.

The size of each light scattering element 455A, etc. may or may not be identical, depending on the application for which they are designed, such as a grating coupler. Forming multiple light scattering elements 556 on top of the core 451 of waveguide 450 can make an optical device, such as a grating coupler. The spacing between the light scattering elements can be periodic or not periodic, depending on the requirements of a specific application. Determining the best size and spacing of the elements of devices such as grating couplers is well known to those skilled in the art.

The materials and processing steps used to fabricate device 556 are the same ones described in detail with respect to FIG. 4, except that FIG. 5 has multiple scattering elements disposed on silicon waveguide core 451.

The operation of light scattering elements 556 in FIG. 5 is similar to the operation of light scattering element 455 in FIG. 4. Light 60 propagating through waveguide 450 is confined primarily to the core 451 as shown by power distribution graph 61. As light 60 enters the regions of the core 451 under the light scattering elements 455A, etc. some of the light is scattered upwards as shown by arrows 62 and some of the light is scattered downwards as shown by arrows 63. Light scattering elements 556 provide an optical coupling between the core 451 and the layers above and below the core.

Light can also travel in the opposite direction through the light scattering elements 556, so that light, which is propagating down from a higher level can be coupled into the core 451 of waveguide 450 by the multiple light scattering elements 556. The light incident from above on the light scattering elements 556 will be coupled into waveguide 450. The light incident from above could be propagating through an optical fiber, for example, where the end of the optical fiber is placed in direct contact with the top layer of the integrated circuit, just above the light scattering elements 556.

A typical integrated circuit 400 will have several metal layers above the dielectric layers 5 to provide for interconnections between the components fabricated on the same substrate, but these layers are not shown in FIG. 4. For light to be scattered up out of waveguide 450 or for light to be coupled into waveguide 450 from above, there cannot be any segments or pieces of any metal layers directly above light scattering elements 556.

In alternate embodiments of the present invention, light scattering elements 556 are fabricated without dielectric layer 6.

As was discussed with respect to light scattering element 455 in FIG. 4, many parts of the light scattering elements 556 of FIG. 5 and the CMOS transistor 160 are made of the same materials and can be made at the same time during the fabrication of a monolithic CMOS integrated circuit.

FIG. 5A is a table summarizing the parts of waveguide 450 and the light scattering elements 556 of FIG. 5 and the CMOS transistor 160, which are formed from the same materials at the same time on the same substrate.

One particularly advantageous aspect of the present invention is the use of salicide blocking layer 3, which is part of the standard CMOS process, as a part of the cladding of waveguide 450 and light scattering elements 556. Salicide blocking layer 3 is an essential layer in the CMOS process of forming the ohmic contacts needed to make electrical connections to transistor 160. Salicide blocking layer 3 prevents the deposition of cobalt silicide in any part of a CMOS integrated circuit, where it is not needed. If cobalt silicide is deposited into the core of optical waveguide 450, light will not be able to pass through that section of the waveguide. Thus, salicide blocking layer 3 is essential to protecting the core of optical waveguide 450 from the light blocking deposition of metallic cobalt silicide.

A particularly advantageous aspect of the present invention is the fabrication of parts of light scattering elements 556 and parts of CMOS transistor 160 at the same time using the same materials on the same substrate, during standard CMOS processing steps.

Figure 6:
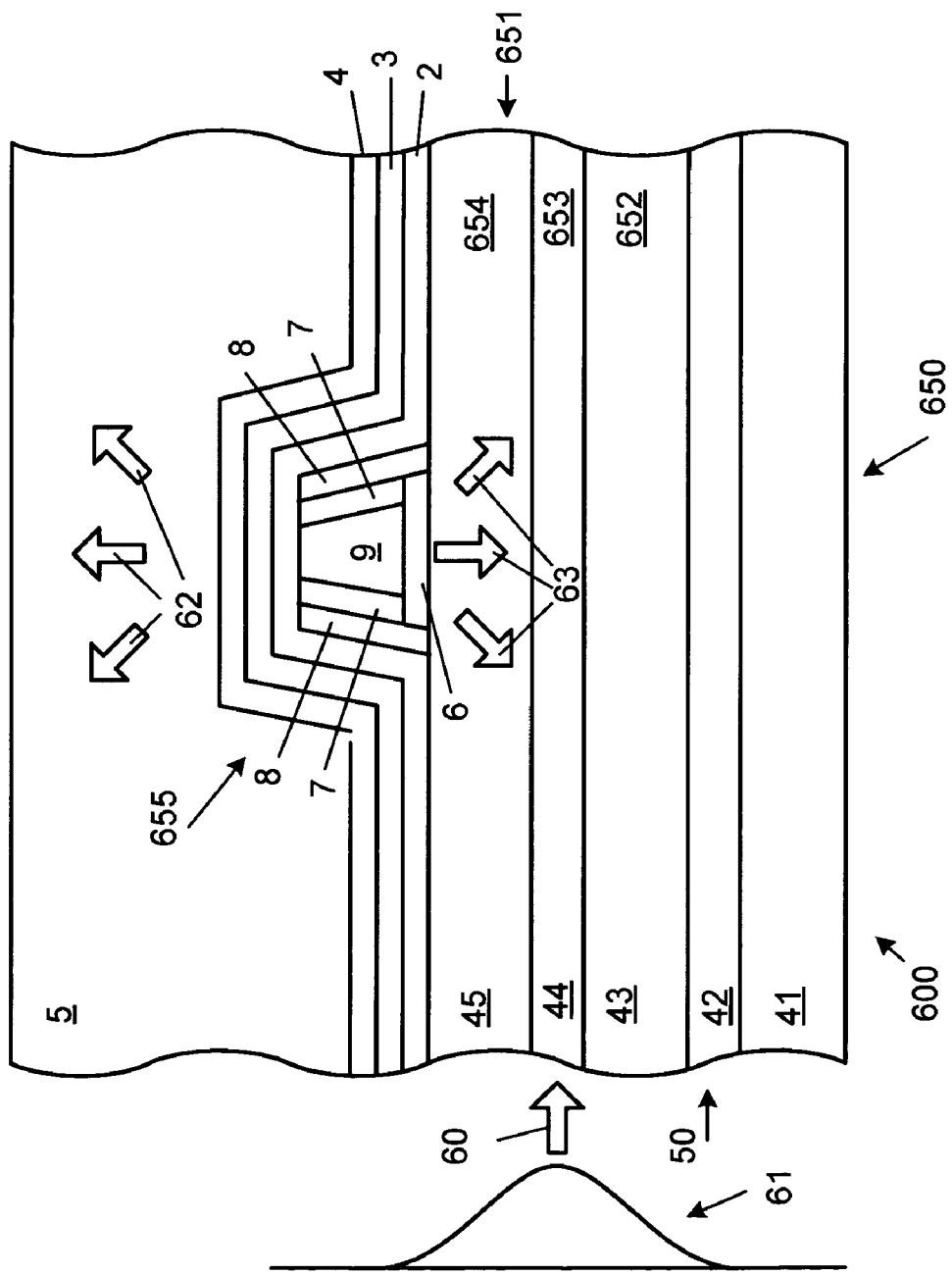
FIG. 6 is a side view of a strip loaded waveguide with a light scattering element, according to one embodiment of the present invention.

FIG. 6 is a side view, not to scale, of strip loaded waveguide 650 with light scattering element 655, according to one embodiment of the present invention. Light scattering element 655 and optical waveguide 650 are part of integrated circuit 600, which has been fabricated on substrate 50. Substrate 50 is made of dielectric layer 44, which is typically made of silicon dioxide, silicon layer 43, silicon dioxide layer 42 and silicon layer 41. On top of silicon dioxide layer 44 is silicon layer 45. Layers 45, 44, 43, 42 and 41 together form a wafer, and integrated optical and electronic devices can be formed on such a wafer using standard CMOS processes.

Waveguide 650 is made of core 651 and surrounding layers of cladding. Core 651 is made of silicon slab 652 (part of layer 43), dielectric layer 653 (part of layer 44) and silicon strip 654 (part of layer 45). Silicon dioxide layer 42 functions as bottom cladding for core 651. Surrounding silicon strip 654, on both sides of it, but not visible in FIG. 6, are layers of sidewall passivation 1 and sections of field oxide 15, which serve as side cladding. Sidewall passivation layers 1 and field oxide 15 are made of dielectric material, typically silicon dioxide. Sidewall passivation can be formed by the thermal oxidation of silicon.

Light scattering element 655 is disposed on top of silicon core 651. Light scattering element 655 includes dielectric layer 6, polysilicon structure 9, sidewall passivation layers 7, dielectric layers 8 and surrounding cladding. Dielectric layer 6, sidewall passivation layer 7 and dielectric layer 8 are typically made of silicon dioxide.

Polysilicon structure 9 in a cross sectional view can have one of many possible shapes, such as those of a square, a rectangle, a trapezoid or other form. The design of polysilicon structure 9, including its size and shape is dependent on the requirements of a particular application and is well known to those skilled in the art.

On top of core 651 are dielectric layers 2, 3, 4 and 5, which function as a top cladding. Layer 2 is an oxide spacer layer of dielectric material, typically silicon dioxide. Layer 3 is a salicide block layer of dielectric 11 material, typically silicon nitride. Layer 4 is a contact punch-through layer of dielectric material, which can be deposited from a mixture of silicon, oxygen and nitrogen. Layer 5 is an inter-layer dielectric (ILD), which can be made of multiple layers of dielectric material.

The materials and processing steps used to fabricate light scattering element 655 are the same ones described in detail with respect to FIG. 4, except that light scattering element 655 is fabricated on a different substrate.

The operation of light scattering element 655 in FIG. 6 is similar to the operation of light scattering element 455 in FIG. 4. Light 60 propagating through waveguide 450 is confined primarily to the core 651 as shown by power distribution graph 61. As the light enters the regions of the core 651 under the light scattering elements 655, some of the light is scattered upwards as shown by arrows 62 and some of the light is scattered downwards as shown by arrows 63. Light scattering element 655 provides an optical coupling between the core 651 and the layers above and below the core.

Light can also travel in the opposite direction through light scattering element 655, so that light, which is propagating down from a higher level can be coupled into the core 651 of waveguide 650 by light scattering element 655. The light incident from above on light scattering element 655 can be coupled into waveguide 650.

Forming multiple light scattering elements 655 on top of the core 651 of waveguide-650 can make an optical device, such as a grating coupler. Designing such a grating coupler will require, among other things, determining the number, shape, size and spacing of the light scattering elements 655 and such design is well known to those skilled in the art.

A typical integrated circuit 600 will have several metal layers above the dielectric layers 5 to provide for interconnections between the components fabricated on the same substrate, but these layers are not shown in FIG. 6. For light to be scattered up out of waveguide 650 or for light to be coupled into waveguide 650 from above, there cannot be any segments or pieces of any metal layers directly above light scattering element 655.

In alternate embodiments of the present invention, light scattering element 655 is fabricated without dielectric layer 6, so that polysilicon structure 9 is disposed on silicon waveguide core 651.

The dielectric materials listed herein with respect to FIG. 1 are all usable as dielectric materials for waveguide 650 shown in FIG. 6.

As was discussed with respect to light scattering element 455 in FIG. 4, many parts or elements of light scattering element 655 of FIG. 6 and the CMOS transistor 160 are made of the same materials and can be made at the same time during the fabrication of a monolithic CMOS integrated circuit.

FIG. 6A is a table summarizing the elements of waveguide 650 and the light scattering element 655 of FIG. 6 and CMOS transistor 160, which are formed from the same materials at the same time on the same substrate.

One particularly advantageous aspect of the present invention is the use of salicide blocking layer 3, which is part of the standard CMOS process, as an element of the cladding for waveguide 650 and light scattering element 655. Salicide blocking layer 3 is an essential layer in the CMOS process of forming the ohmic contacts needed to make electrical connections to the transistor 160. Salicide blocking layer 3 prevents the deposition of cobalt silicide in any part of a CMOS integrated circuit, where it is not needed. If cobalt silicide is deposited into the core of optical waveguide 650, light will not be able to pass through that section of the waveguide. Thus, salicide blocking layer 3 is essential to protecting the core of optical waveguide 650 from the light blocking deposition of metallic cobalt silicide.

A particularly advantageous aspect of the present invention is the fabrication of the parts of light scattering element 655 and the elements of CMOS transistor 160 at the same time and using the same materials on the same substrate, during standard CMOS processing steps.

Figure 7:
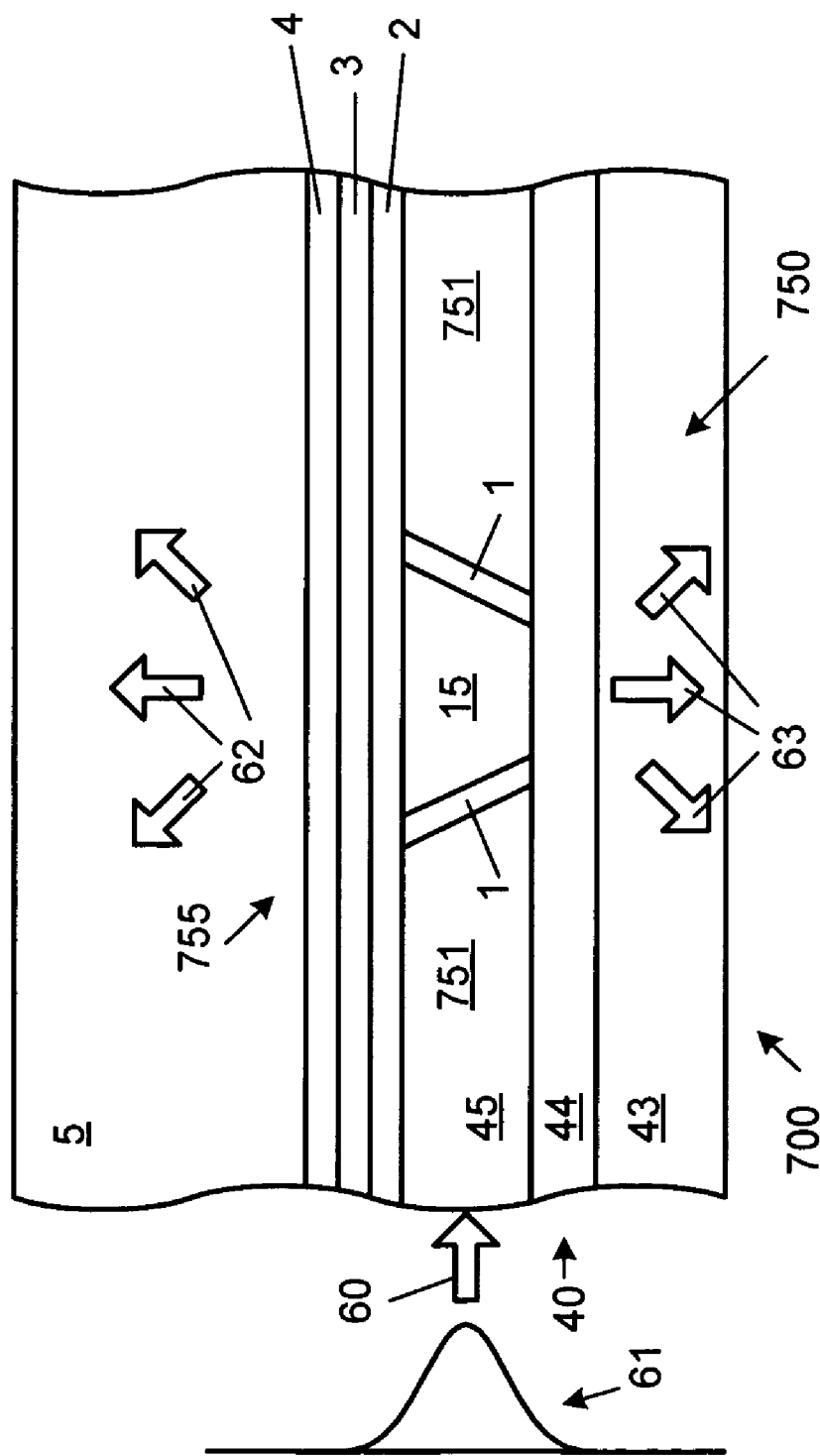
FIG. 7 is a side view of a waveguide with a light scattering element, according to one embodiment of the present invention.

FIG. 7 is a side view, not to scale, of a waveguide 750 with light scattering element 755, according to one embodiment of the present invention. Optical waveguide 750 and light scattering element 755 are part of integrated circuit 700, which has been fabricated on substrate 40. Substrate 40 is made of dielectric layer 44, which is typically made of silicon dioxide and silicon layer 43. On top of silicon dioxide layer 44 is silicon layer 45. Layers 45, 44 and 43 together form what is commonly referred to as a SOI (silicon on insulator) wafer, which is frequently used for the production of CMOS integrated circuits.

Waveguide 750 is made of silicon core 751 and the surrounding layers of cladding. Silicon core 751 in a cross sectional view can have one of many possible shapes, such as those of a square, a rectangle, a trapezoid or other form. Silicon dioxide layer 44 functions as a bottom cladding for core 751. Sidewall passivation layers and sections of field oxide, not shown in FIG. 7, are made of dielectric materials and provide side cladding for waveguide core 751. Sidewall passivation can be formed by the thermal oxidation of silicon.

Light scattering element 755 is formed in silicon core 751 and covered by cladding. Light scattering element 755 can be formed by a variety of methods, such as by etching. Light scattering element 755 includes sidewall passivation layers 1 and field oxide section 15. Sidewall passivation layers 1 and field oxide 15 are typically made of silicon dioxide. Field oxide 15 is preferably formed in such a manner as to be level with the top of silicon core 751.

Light scattering element 755 in a cross sectional view can have one of many possible shapes, such as those of a square, a rectangle, a trapezoid or other form. The size and shape of light scattering element 755 is dependent on the requirements of a particular application and is well known to those skilled in the art.

On top of waveguide core 751 and the light scattering element 755 are dielectric layers 2, 3, 4 and 5, which provide top cladding for waveguide core 751 and light scattering element 755. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-layer dielectric (ILD), which can be made of multiple layers of dielectric material. ILD layer 5 can be made of silicon dioxide or preferably, a low k dielectric, such as silicon carbon oxide.

Light 60 propagating through waveguide core 751 will be mainly confined to the core 751, primarily in a single mode, due to the large difference in refractive indices between silicon core 751 and the surrounding claddings. The single mode distribution of light propagating in core 751 is shown by graph 61, which shows that the peak power level of the light in waveguide 750 is primarily near to the center of core 751. Graph 61 is an approximate illustration of the distribution of power in waveguide 750. Silicon core 751 has a refractive index (n) of approximately 3.5 as compared to a refractive index of about 1.5 for silicon dioxide, which is the primary material of the claddings.

As light 60 travels through waveguide 750, it is primarily confined near to the center of the core 751, but when the light reaches the boundary with light scattering element 755, some of the light is scattered downward, as shown by arrow 63 and some is scattered upward, as shown by arrow 62. The scattering of light 60 by light scattering element 755 is primarily due to the abrupt change in refractive index at the boundary between silicon core 751 and the dielectric materials in the light scattering element 755. Light scattering element 755 includes sidewall passivation layers 1 and field oxide 15, which are both typically made of silicon dioxide. Monocrystalline silicon has a refractive index of about 3.5, whereas silicon dioxide has a refractive index of about 1.5.

Light scattering element 755, if it is part of a grating coupler, can provide an optical coupling between the core 751 and the layers above and below the core.

Light can also travel in the opposite direction through light scattering element 755, so that light, which is propagating down from a higher level can be coupled into the core 751 of waveguide 750 by light scattering element 755.

A typical integrated circuit 700 will have several metal layers above the dielectric layers 5 to provide for interconnections between the components fabricated on the same substrate, but these layers are not shown in FIG. 7. For light to be scattered up out of waveguide 750 or for light to be coupled into waveguide 750 from above, there cannot be any segments or pieces of any metal layers directly above light scattering element 755.

Forming multiple light scattering elements 755 in the core 751 of waveguide 750 can make an optical device, such as a grating coupler. Designing such a grating coupler will require, among other things, determining the number, shape, size and spacing of the light scattering elements 755 and such design is well known to those skilled in the art.

Many parts or elements of light scattering element 755 of FIG. 7 and the CMOS transistor 160 are made of the same materials and can be made at the same time during the fabrication of a monolithic CMOS integrated circuit.

FIG. 7A is a table summarizing the parts of waveguide 750 and the light scattering element (trench) 755 of FIG. 7 and the CMOS transistor 160, which are formed from the same materials at the same time on the same substrate.

Silicon layer 45 is used to form the silicon core 751 and the silicon body 161 of CMOS transistor 160. These silicon elements can be formed of the same material at the same time during the fabrication of a monolithic CMOS integrated circuit.

Light scattering element 755 can be formed by a variety of methods, such as by etching into silicon layer 45. Light scattering element 755 and a trench around the silicon body of the CMOS transistor 160 can be formed at the same time on the same substrate.

Sidewall passivation layers 1 of light scattering element 755 and the sidewall passivation layers 1 for the silicon body of CMOS transistor 160 can be formed at the same time of the same dielectric material on the same substrate.

Field oxide section 15 in light scattering element 755 and the field oxide 15 surrounding the body of CMOS transistor 160 can be formed at the same time from the same dielectric material on the same substrate.

Dielectric layers 2, 3, 4 and 5 used to form the cladding for waveguide 750 and the light scattering element 755 and dielectric layers 2, 3, 4 and 5 of CMOS transistor 160 can be formed at the same time of the same dielectric materials on the same substrate.

One particularly advantageous aspect of the present invention is the use of the salicide blocking layer 3, which is part of the standard CMOS process, as an element of the cladding for waveguide 750 and the light scattering element 755. Salicide blocking layer 3 is an essential layer in the CMOS process of forming the ohmic contacts needed to make electrical connections to the transistor 160. Salicide blocking layer 3 prevents the deposition of cobalt silicide in any part of a CMOS integrated circuit, where it is not needed. If cobalt silicide is deposited into the core of optical waveguide 750, light will not be able to pass through that section of the waveguide. Thus, salicide blocking layer 3 is essential to protecting the core of optical waveguide 750 from the light blocking deposition of metallic cobalt silicide.

A particularly advantageous aspect of the present invention is the fabrication of the parts of light scattering element 755 and the elements of CMOS transistor 160 at the same time and using the same materials on the same substrate, during standard CMOS processing steps.

Figure 8:
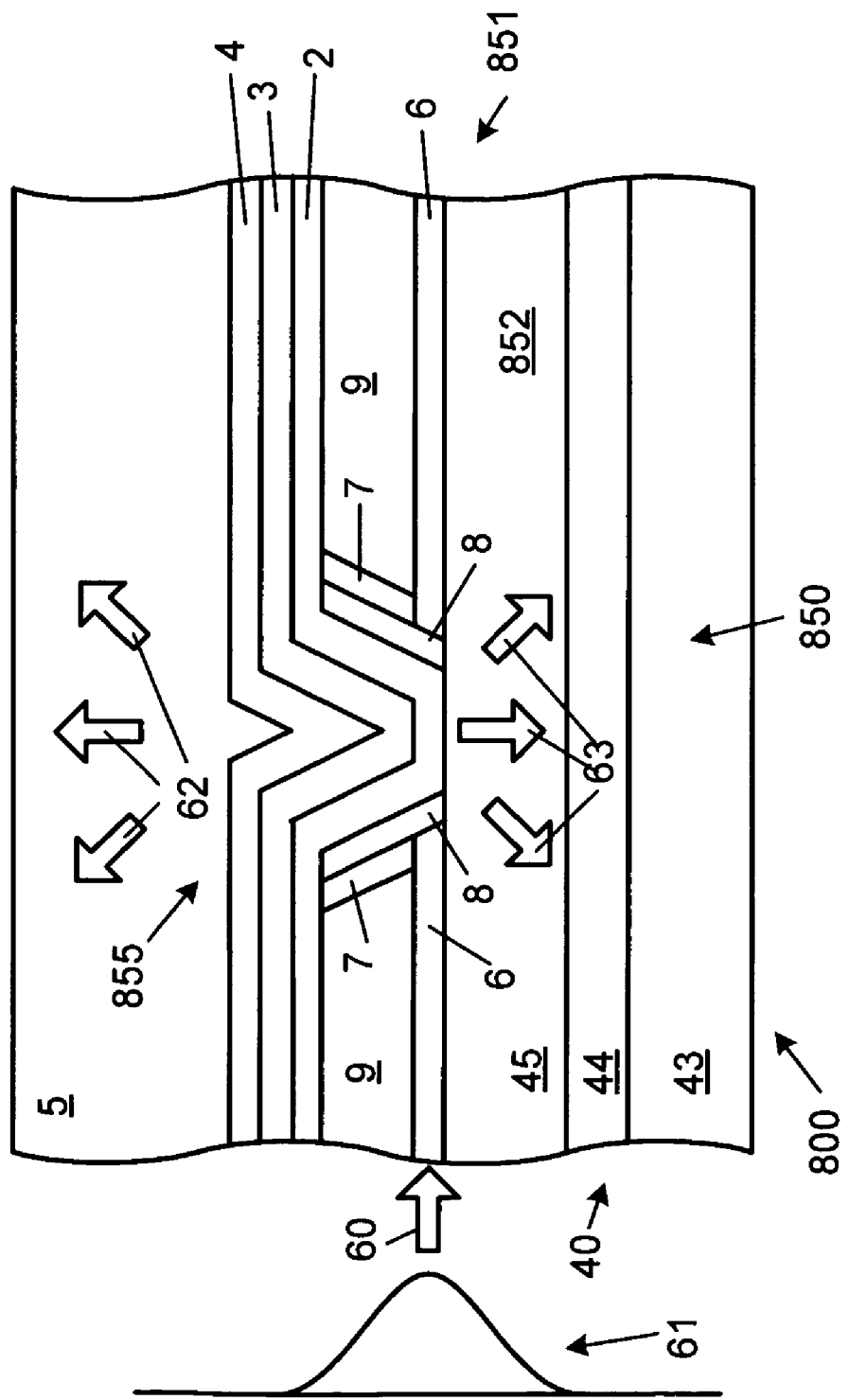
FIG. 8 is a side view of a strip loaded waveguide with a light scattering element, according to one embodiment of the present invention.

FIG. 8 is a side view, not to scale, of strip loaded waveguide 850 with light scattering element 855, according to one embodiment of the present invention. Optical waveguide 850 and light scattering element 855 are part of integrated circuit 800, which has been fabricated on substrate 40. Substrate 40 is made of dielectric layer 44, which is typically made of silicon dioxide and silicon layer 43. On top of silicon dioxide layer 44 is silicon layer 45. Layers 45, 44 and 43 together form what is commonly referred to as a SOI (silicon on insulator) wafer, which is frequently used for the production of CMOS integrated circuits.

Waveguide 850 is made of core 851 and surrounding layers of cladding. Core 851 is made of silicon slab 852, dielectric layer 6 and polysilicon strip 9. Silicon slab 852 is formed from silicon layer 45. Polysilicon strip 9 in a cross sectional view can have one of many possible shapes, such as those of a square, a rectangle, a trapezoid or other form. Silicon dioxide layer 44 functions as a bottom cladding for core 851. Sidewall passivation layers and sections of field oxide on the sides of silicon slab 852, not shown in FIG. 8, are made of dielectric materials and provide side cladding for silicon slab 852. Sidewall passivation can be formed by the thermal oxidation of silicon.

Light scattering element 855 is formed in core 851. Light scattering element 855 includes sidewall passivation layers 7, dielectric layers 8 and dielectric layers 2, 3, 4 and 5, which also function as cladding. Sidewall passivation layers 7 and dielectric layers 8 are typically made of silicon dioxide.

Light scattering element 855 in a cross sectional view can have one of many possible shapes, such as those of a square, a rectangle, a trapezoid or other form. The size and shape of light scattering element 855 is dependent on the requirements of a particular application and is well known to those skilled in the art.

On top of waveguide core 851 and light scattering element 855 are dielectric layers 2, 3, 4 and 5, which provide cladding for the waveguide core 851 and the light scattering element 855. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-layer dielectric (ILD), which can be made of multiple layers of dielectric material. ILD layer 5 can be made of silicon dioxide or preferably, a low k dielectric, such as silicon carbon oxide.

Light 60 propagating through waveguide core 851 will be mainly confined to the core 851, primarily in a single mode, due to the large difference in refractive indices between the core 851 and the surrounding claddings. The single mode distribution of light propagating in the core 851 is shown by graph 61 which shows that the peak power level of the light in the waveguide 850 is primarily near to the center of core 851. Graph 61 is an approximate illustration of the distribution of power in waveguide 850.

As light 60 travels through waveguide 850 it is primarily confined near to the center of core 851, but when the light reaches the boundary with light scattering element 855, some of the light is scattered downward, as shown by arrows 63 and some is scattered upward, as shown by arrows 62. The scattering of light 60 by light scattering element 855 is primarily due to the abrupt change in refractive index at the boundary between polysilicon strip 9 and the dielectric materials in the light scattering element 855. Light scattering element 855 includes sidewall passivation layers 1 and field oxide 15, which are both typically made of silicon dioxide. Monocrystalline silicon has a refractive index of about 3.5, whereas silicon dioxide has a refractive index of about 1.5.

Light scattering element 855 provides an optical coupling between the core 851 and the layers above and below the core.

Light can also travel in the opposite direction through light scattering element 855, so that light, which is traveling down from a higher level can be optically coupled into the core 851 of waveguide 850 by light scattering element 855.

A typical integrated circuit 800 will have several metal layers above the dielectric layers 5 to provide for interconnections between the components fabricated on the same substrate, but these layers are not shown in FIG. 8. For light to be scattered up out of waveguide 850 or for light to be coupled into waveguide 850 from above, there cannot be any segments or pieces of any metal layers directly above light scattering element 855.

Forming multiple light scattering elements 855 in the core 851 of waveguide 850 can make an optical device, such as a grating coupler. Designing such a grating coupler will require, among other things, determining the number, shape, size and spacing of the light scattering elements 855 and such design is well known to those skilled in the art.

Many parts or elements of light scattering element 855 of FIG. 8 and the CMOS transistor 160 are made of the same materials and can be made at the same time during the fabrication of a monolithic CMOS integrated circuit.

FIG. 8A is a table summarizing the parts of waveguide 850 and the light scattering element (trench) 855 of FIG. 8 and the CMOS transistor, which are formed from the same materials at the same time on the same substrate.

Silicon layer 45 is used to form silicon slab 852 and the silicon body 161 of CMOS transistor 160. These silicon elements can be formed of the same material at the same time during the fabrication of a monolithic CMOS integrated circuit.

Sidewall passivation layers 7 of light scattering element 855 and sidewall passivation layers 7 for the polysilicon gate of CMOS transistor 160 can be formed at the same time of the same dielectric material on the same substrate.

Dielectric layers 8 of light scattering element 855 and dielectric layer 8, which is part of the gate spacer of CMOS transistor 160, can be formed at the same time from the same dielectric material on the same substrate.

Dielectric layers 2, 3, 4 and 5 used to form the cladding for waveguide 850 and the light scattering element 855 and dielectric layers 2, 3, 4 and 5 of CMOS transistor 160 can be formed at the same time of the same dielectric materials on the same substrate.

In an alternate embodiment of the present invention, light scattering element 855 is formed in a strip loaded waveguide, which does not have a dielectric layer 6, where the polysilicon strip 9 is formed on top of silicon slab 852.

One particularly advantageous aspect of the present invention is the use of the salicide blocking layer 3, which is part of the standard CMOS process, as an element of the cladding for the waveguide 850 and the light scattering element 855. Salicide blocking layer 3 is an essential layer in the CMOS process of forming the ohmic contacts needed to make electrical connections to the CMOS transistor 160. Salicide blocking layer 3 prevents the deposition of cobalt silicide in any part of a CMOS integrated circuit, where it is not needed. If cobalt silicide is deposited into the core of optical waveguide 850, light will not be able to pass through that section of the waveguide. Thus, salicide blocking layer 3 is essential to protecting the core of optical waveguide 850 from the light blocking deposition of metallic cobalt silicide.

A particularly advantageous aspect of the present invention is the fabrication of the parts of light scattering element 855 and the parts of CMOS transistor 160 at the same time and using the same materials on the same substrate, during standard CMOS processing steps.

Figure 9:
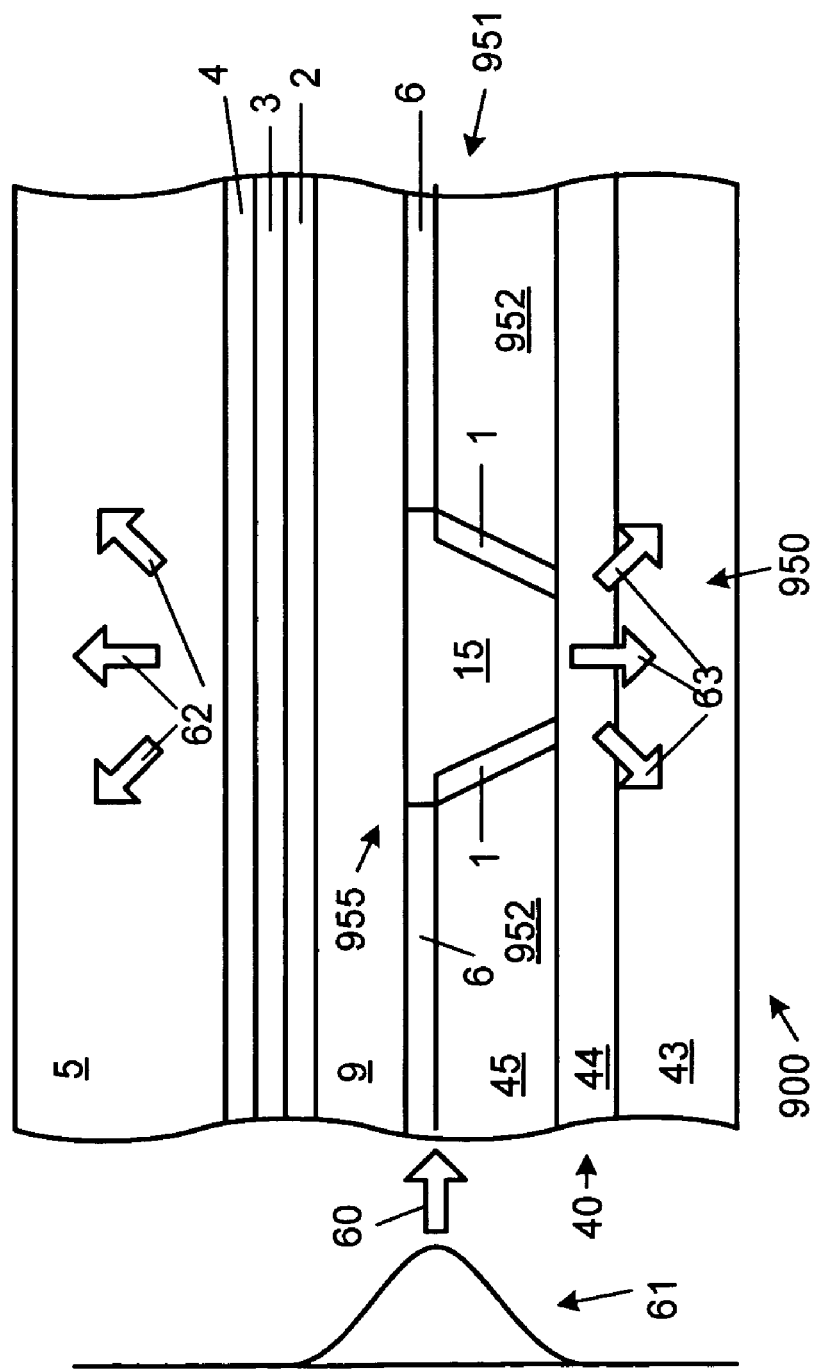
FIG. 9 is a side view of a strip loaded waveguide with a light scattering element, according to another embodiment of the present invention.

FIG. 9 is a side view, not to scale, of strip loaded waveguide 950 with light scattering element 955, according to another embodiment of the present invention. Optical waveguide 950 and light scattering element 955 are part of integrated circuit 900, which has been fabricated on substrate 40. Substrate 40 is made of dielectric layer 44, which is typically made of silicon dioxide and silicon layer 43. On top of silicon dioxide layer 44 is silicon layer 45. Layers 45, 44 and 43 together form what is commonly referred to as a SOI (silicon on insulator) wafer, which is frequently used for the production of CMOS integrated circuits.

Waveguide 950 is made of core 951 and surrounding layers of cladding. Core 951 is made of silicon slab 952, dielectric layer 6 and polysilicon strip 9. Polysilicon strip 9 in a cross sectional view can have one of many possible shapes, such as those of a square, a rectangle, a trapezoid or other form. Silicon dioxide layer 44 functions as a bottom cladding for core 951.

Light scattering element 955 is formed in core 951, primarily in silicon slab 952. Light scattering element 955 includes sidewall passivation layers 1 and is filled in by field oxide 15. Sidewall passivation layers 1 and field oxide 15 are typically made of silicon dioxide. Sidewall passivation can be formed by the thermal oxidation of silicon.

Light scattering element 955 in a cross sectional view can have one of many possible shapes, such as those of a square, a rectangle, a trapezoid or other form. The design of light scattering element 955, such as its size and shape, is dependent on the requirements of a particular application and is well known to those skilled in the art.

On top of waveguide core 951 are dielectric layers 2, 3, 4 and 5, which provide side and top cladding for waveguide core 951. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-layer dielectric (ILD), which can be made of multiple layers of dielectric material. ILD layer 5 can be made of silicon dioxide or preferably, a low k dielectric, such as silicon carbon oxide.

Light 60 propagating through waveguide core 951 will be mainly confined to the core 951, primarily in a single mode, due to the large difference in refractive indices between the core 951 and the surrounding claddings. The single mode distribution of light propagating in core 951 is shown by graph 61, which shows that the peak power level of the light in the waveguide 950 is primarily near to the center of the core 951. Graph 61 is an approximate illustration of the distribution of power in waveguide 950.

As light 60 travels through waveguide 950 it is primarily confined near to the center of core 951, but when the light reaches the boundary with the light scattering element 955, some of the light is scattered downward, as shown by arrows 63 and some is scattered upward, as shown by arrows 62. The scattering of light 60 by light scattering element 955 is primarily due to the abrupt change in refractive index at the boundary between silicon slab 952 and the dielectric materials in light scattering element 955. Light scattering element 955 includes sidewall passivation layers 1 and field oxide 15, which are both typically made of silicon dioxide. Monocrystalline silicon has a refractive index of about 3.5, whereas silicon dioxide has a refractive index of about 1.5.

Light scattering element 955 provides an optical coupling between the core 951 and the layers above and below the core.

Light can also travel in the opposite direction through the light scattering element 955, so that light, which is propagating down from a higher level can be optically coupled into the core 951 of waveguide 950 by light scattering element 955.

A typical integrated circuit 900 will have several metal layers above the dielectric layers 5 to provide for interconnections between the components fabricated on the same substrate, but these layers are not shown in FIG. 9. For light to be scattered up out of waveguide 950 or for light to be coupled into waveguide 950 from above, there cannot be any segments or pieces of any metal layers directly above light scattering element 955.

Forming multiple light scattering elements 955 in the core 951 of waveguide 950 can make an optical device, such as a grating coupler. Designing such a grating coupler will require, among other things, determining the number, shape, size and spacing of the light scattering elements 955 and such design is well known to those skilled in the art.

Many parts or elements of waveguide 950 and the light scattering element 955 of FIG. 9 and the CMOS transistor 160 are made of the same materials and can be made at the same time during the fabrication of a monolithic CMOS integrated circuit.

FIG. 9A is a table summarizing the parts of waveguide 950 and the light scattering element (trench) 955 of FIG. 9 and the CMOS transistor, which are formed from the same materials at the same time on the same substrate.

Silicon layer 45 is used to form the silicon slab 952 of core 951 and the silicon body 161 of CMOS transistor 160. These silicon elements can be formed of the same material at the same time on the same substrate.

Sidewall passivation layers 1 of light scattering element 955 and the sidewall passivation layers 1 for the silicon body 161 of CMOS transistor 160 can be formed at the same time of the same dielectric material on the same substrate.

Field oxide 15 of light scattering element 955 and the field oxide 15 around the silicon body 161 of CMOS transistor 160 can be formed at the same time of the same dielectric material on the same substrate.

Dielectric layer 6 of light scattering element 955 and dielectric layer 6 of CMOS transistor 160 can be formed at the same time of the same dielectric material on the same substrate.

Polysilicon strip 9 of light scattering element 955 and polysilicon strip 9 of CMOS transistor 160 can be formed at the same time of the same material on the same substrate.

Dielectric layers 2, 3, 4 and 5 used to form the cladding for waveguide 950 and the light scattering element 955 and dielectric layers 2, 3, 4 and 5 of CMOS transistor 160 can be formed at the same time of the same dielectric materials on the same substrate.

In an alternate embodiment of the present invention, light scattering element 955 is formed in a strip loaded waveguide, which does not have a dielectric layer 6, where polysilicon strip 9 is formed on top of silicon slab 952.

One particularly advantageous aspect of the present invention is the use of salicide blocking layer 3, which is part of the standard CMOS process, as an element of the cladding for waveguide 950 and light scattering element 955. Salicide blocking layer 3 is an essential layer in the CMOS process of forming the ohmic contacts needed to make electrical connections to CMOS transistor 160. Salicide blocking layer 3 prevents the deposition of cobalt silicide in any part of a CMOS integrated circuit, where it is not needed. If cobalt silicide is deposited into the core of optical waveguide 950, light will not be able to pass through that section of the waveguide. Thus, salicide blocking layer 3 is essential to protecting the core of optical waveguide 950 from the light blocking deposition of metallic cobalt silicide.

A particularly advantageous aspect of the present invention is the fabrication of the parts of waveguide 950, the parts of light scattering element 955 and the elements of CMOS transistor 160 at the same time and using the same materials on the same substrate, during standard CMOS processing steps.

Figure 10:
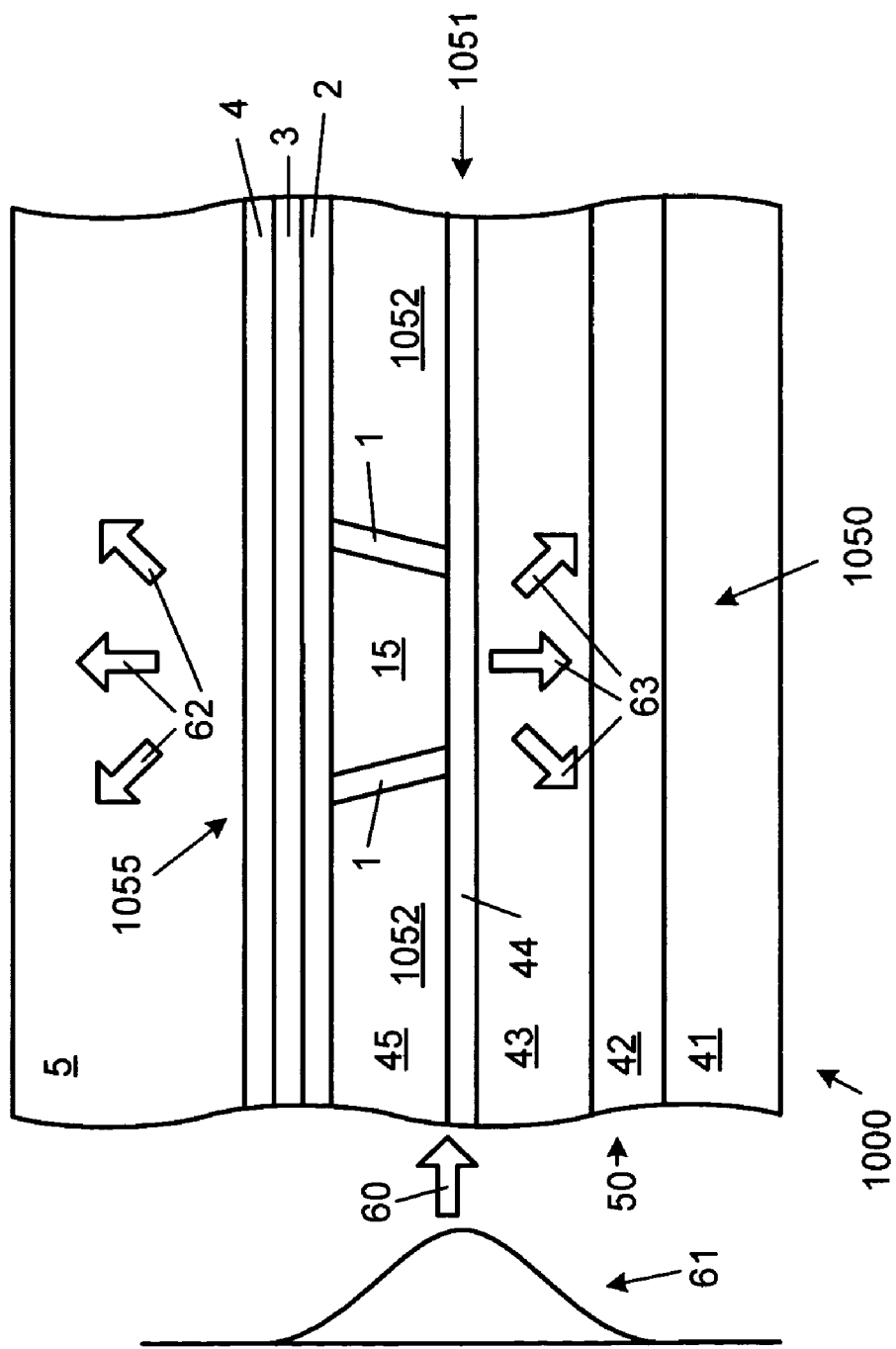
FIG. 10 is a side view of a strip loaded waveguide with a light scattering element, according to one embodiment of the present invention.

FIG. 10 is a side view, not to scale, of strip loaded waveguide 1050 with light scattering element 1055, according to one embodiment of the present invention. Light scattering element 1055 and optical waveguide 1050 are part of integrated circuit 1000, which has been fabricated on substrate 50. Substrate 50 is made of dielectric layer 44, which is typically made of silicon dioxide, silicon layer 43, silicon dioxide layer 42 and silicon layer 41. On top of silicon dioxide layer 44 is silicon layer 45. Layers 45, 44, 43, 42 and 41 together form a wafer, and integrated optical and electronic devices can be formed on such a wafer using standard CMOS processes.

Waveguide 1050 is made of core 1051 and surrounding layers of cladding. Core 1051 is made of silicon layer 43, dielectric layer 44 and silicon strip 1052. Silicon dioxide layer 42 functions as bottom cladding for core 1051. Surrounding silicon strip 1052 on both sides of it, but not shown in FIG. 10, are sidewall passivation layers 1 and sections of field oxide 15, which serve as side cladding. Sidewall passivation can be formed by the thermal oxidation of silicon.

Light scattering element 1055 is formed in silicon strip 1052. Light scattering element 1055 includes sidewall passivation layers 1 and field oxide 15, which are typically made of silicon dioxide.

Light scattering element 1055 in a cross sectional view can have one of many possible shapes, such as those of a square, a rectangle, a trapezoid or other form. The design of light scattering element 1055, including its size and shape, is dependent on the requirements of a particular application and is well known to those skilled in the art.

On top of core 1051 are dielectric layers 2, 3, 4 and 5, which function as top cladding. Layer 2 is an oxide spacer layer of dielectric material, typically silicon dioxide. Layer 3 is a salicide block layer of dielectric material, typically silicon nitride. Layer 4 is a contact punch-through layer of dielectric material, which can be deposited from a mixture of silicon, oxygen and nitrogen. Layer 5 is an inter-layer dielectric (ILD), which can be made of multiple layers of dielectric material.

The materials and processing steps used to fabricate light scattering element 1055 are the same ones described in detail with respect to FIG. 7, except that light scattering element 1055 is fabricated on a different substrate.

The operation of light scattering element 1055 in FIG. 10 is similar to the operation of light scattering element 755 in FIG. 7. Light 61 propagating through the waveguide 1050 is confined primarily to the core 1051 as shown in power distribution graph 60.

As light 60 travels through waveguide 1050 it is primarily confined near to the center of core 1051, but when the light reaches the boundary with light scattering element 1055, some of the light is scattered downward, as shown by arrows 63 and some is scattered upward, as shown by arrows 62. The scattering of light 60 by light scattering element 1055 is primarily due to the abrupt change in refractive index at the boundary between silicon slab 1054 and the dielectric materials in light scattering element 1055. Light scattering element 1055 includes sidewall passivation layers 1 and field oxide 15, which are both typically made of silicon dioxide. Monocrystalline silicon has a refractive index of about 3.5, whereas silicon dioxide has a refractive index of about 1.5.

Light scattering element 1055 provides an optical coupling between the core 1051 and the layers above and below the core.

Light can also travel in the opposite direction through light scattering element 1055, so that light, which is propagating down from a higher level can be coupled into the core 1051 of waveguide 1050 by light scattering element 1055. The light incident from above on light scattering element 1055 will be coupled into waveguide 1050.

Forming multiple light scattering elements 1055 in the core 1051 of waveguide 1050 can make an optical device, such as a grating coupler. Designing such a grating coupler will require, among other things, determining the number, shape, size and spacing of the light scattering elements 1055 and such design is well known to those skilled in the art.

A typical integrated circuit 1000 will have several metal layers above the dielectric layers 5 to provide for interconnections between the components fabricated on the same substrate, but these layers are not shown in FIG. 10. For light to be scattered up out of waveguide 1050 or for light to be coupled into waveguide 1050 from above, there cannot be any segments or pieces of any metal layers directly above light scattering element 1055.

The dielectric materials listed herein with respect to FIG. 1 are all usable as dielectric materials for waveguide 1050 shown in FIG. 10.

As was discussed with respect to light scattering element 755 in FIG. 7, many parts or elements of light scattering element 1055 of FIG. 10 and the CMOS transistor 160 are made of the same materials and can be made at the same time during the fabrication of a monolithic CMOS integrated circuit.

FIG. 10A is a table summarizing the parts of waveguide 1050 and the light scattering element (trench) 1055 of FIG. 10 and the CMOS transistor 160, which are formed from the same materials at the same time on the same substrate.

One particularly advantageous aspect of the present invention is the use of salicide blocking layer 3, which is part of the standard CMOS process, as an element of the cladding for waveguide 1050 and light scattering element 1055. Salicide blocking layer 3 is an essential layer in the CMOS process of forming the ohmic contacts needed to make electrical connections to CMOS transistor 160. Salicide blocking layer 3 prevents the deposition of cobalt silicide in any part of a CMOS integrated circuit, where it is not needed. If cobalt silicide is deposited into the core of optical waveguide 1050, light will not be able to pass through that section of the waveguide. Thus, salicide blocking layer 3 is essential to protecting the core 1051 of optical waveguide 1050 from the light blocking deposition of metallic cobalt silicide.

A particularly advantageous aspect of the present invention is the fabrication of the parts of waveguide 1050, the parts of light scattering element (trench) 1055 and the parts of CMOS transistor 160 at the same time and using the same materials on the same substrate, during standard CMOS processing steps.

Figure 11:
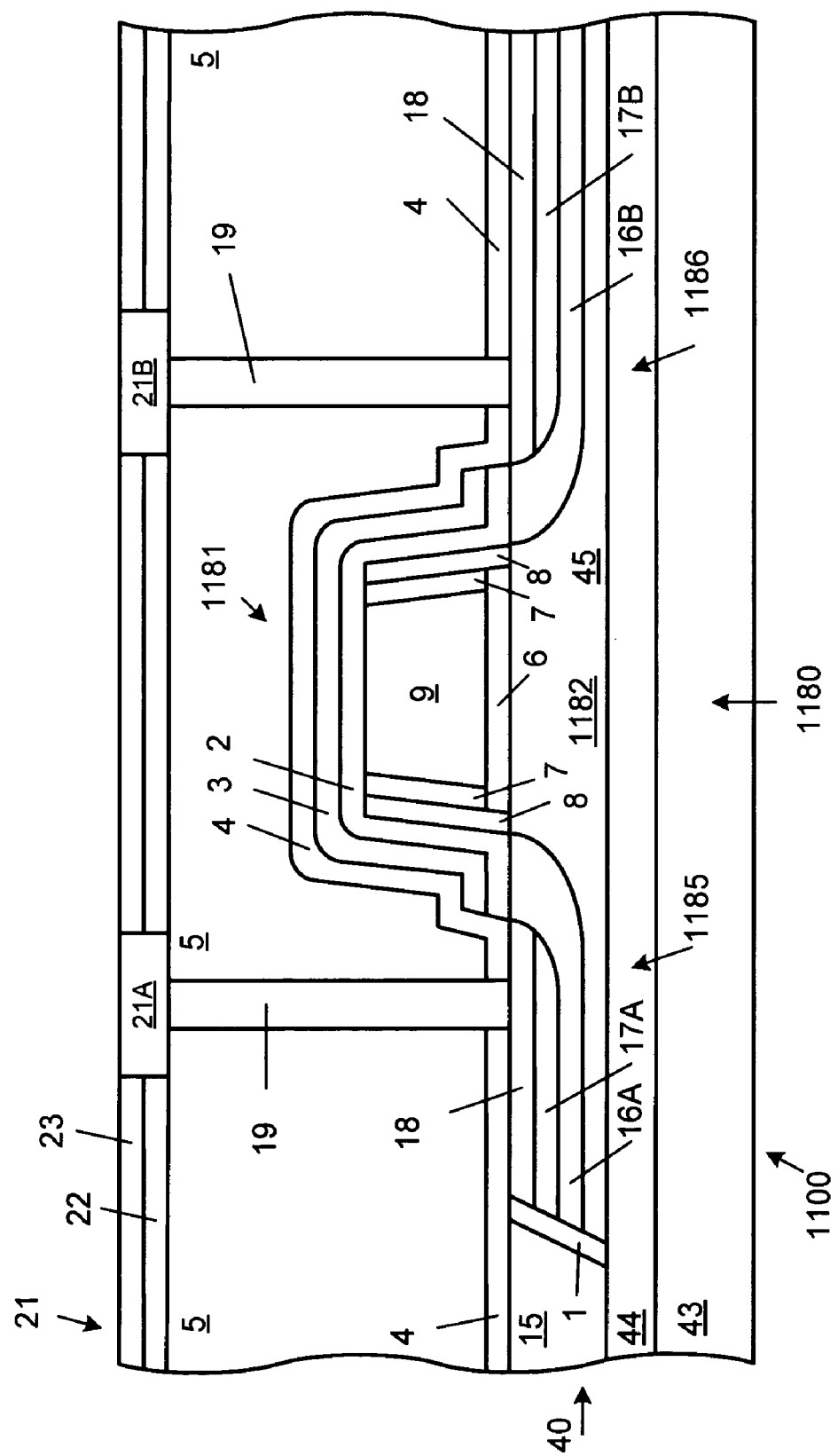
FIG. 11 is a cross sectional view of an active waveguide, according to one embodiment of the present invention.

FIG. 11 is a cross sectional view, not to scale, of active waveguide 1180, according to one embodiment of the present invention.

Active waveguide 1180 and CMOS transistor 160 are part of integrated circuit 1100, which has been fabricated on substrate 40. Substrate 40 is made of dielectric layer 44, which is typically made of silicon dioxide and silicon layer 43. On top of silicon dioxide layer 44 is silicon layer 45. Layers 45, 44 and 43 together form what is commonly referred to as a SOI (silicon on insulator) wafer, which is frequently used for the production of CMOS integrated circuits.

Active waveguide 1180 is made of core 1181 and surrounding layers of cladding. The core 1181 is made of silicon slab 1182, dielectric layer 6 and polysilicon strip 9. Polysilicon strip 9 in a cross sectional view can have one of many possible shapes, such as those of a square, a rectangle, a trapezoid or other form. Silicon dioxide layer 44 functions as a bottom cladding for core 1181. On one side of silicon slab 1182 is a layer of sidewall passivation 1 and a section of field oxide 15, which serve as side claddings. Sidewall passivation layer 1 is made of dielectric material, typically silicon dioxide. Sidewall passivation can be formed by the thermal oxidation of silicon. Field oxide 15 is made of dielectric material, typically silicon dioxide. The sides of polysilicon strip 9 are covered by sidewall passivation layers 7 and dielectric spacer 8. Dielectric layer 6 and dielectric spacer 8 are typically made of silicon dioxide.

On top of core 1181 are dielectric layers 2, 3, 4 and 5, which function as cladding. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material. An ILD like layer 5 can be made of silicon dioxide, but preferably of a low k dielectric, such as silicon carbon oxide.

Active waveguide 1180 as an electronic device operates as a PIN diode. Silicon slab 1182 includes a well implant, which can be positively or negatively doped. In alternate embodiments, silicon slab 1182 does not include a well implant.

Silicon slab 1182 includes doped region 1185 and oppositely doped region 1186, so if region 1185 is P doped, then region 1186 is N doped. Into region 1185 are placed extension implants 16A and source implant 17A. Into region 1186 are placed extension implants 16B and drain implant 17B. Implants 16A and 17A have the same polarity. Implants 16B and 17B are oppositely charged to implants 16A and 17A.

Ohmic contacts 18, typically of cobalt silicide, are made into the doped regions 1185 and 1186 of active waveguide 1180. After the ohmic contacts 18 have been formed, layers 4 and 5 can be deposited. Coming through layers 4 and 5 are conductive plugs 19, typically made of tungsten, which connect ohmic contacts 18 to metal segments 21A and 21B of the first metal layer 21.

First metal layer 21 (M1) is typically made of copper and connects to conductive plugs 19 from active waveguide 1180 and provides electrical connections to other circuits on integrated circuit 1100.

Integrated circuits typically have more than one metal layer, but for purposes of simplifying the diagram, no other metal layers are shown in FIG. 11.

Active waveguide 1180 can operate as different types of optoelectronic devices, depending on how it is designed and configured, including such devices as a waveguide phase shifter or an attenuator, and such operation is well known to those skilled in the art.

Active waveguide 1180 can operate as a waveguide phase shifter by forward biasing the PIN diode within it using metal connections 21A and 21B. A voltage applied across active waveguide 1180 can change the free carrier density in silicon slab 1182, which can alter the refractive index within silicon slab 1182. Altering the refractive index as light propagates through active waveguide 1180 can cause a phase shift and/or attenuation in the light. An active waveguide 1180 can be designed so that varying the voltage across the PIN diode will primarily change the amount of phase shift in light propagating through the device. Active waveguide 1180 operating as a waveguide phase shifter can be used as part of a Mach-Zehnder interferometer functioning as a light modulator.

In alternate embodiments, implants 16A, 16B, 17A and 17B can all be of the same polarity, either positively or negatively charged. When the implants are all charged with the same polarity, then active waveguide 1180, as an electronic device operates as a CMOS resistor. If active waveguide 1180 is fabricated as a resistor and a variable voltage is applied across the device, then the free carrier density in the silicon slab 1182 is altered, which can change the refractive index within silicon slab 1182. Altering the refractive index as light propagates through active waveguide 1180 can cause a phase shift and/or attenuation in the light. An active waveguide 1180 can be designed so that varying the voltage across the PIN diode will primarily change the amount of attenuation in the light propagating through the device.

An active waveguide operating as a variable attenuator can function as an adjustable loss element, and such a device is sometimes referred to as a VOA or Viable Optical Attenuator.

Many parts or elements of active waveguide 1180 and the CMOS transistor 160 are made of the same materials and can be made at the same time during the fabrication of a monolithic CMOS integrated circuit.

FIG. 11A is a table summarizing the elements of the active waveguide 1180 of FIG. 11 and the CMOS transistor 160, which are formed from the same materials at the same time on the same substrate.

Silicon layer 45 is used to form silicon slab 1182 of active waveguide 1180 and the silicon body 161 of CMOS transistor 160. These silicon elements can be formed of the same material at the same time during the fabrication of a monolithic CMOS integrated circuit.

Sidewall passivation layer 1 of silicon slab 1182 and sidewall passivation layers 1 of CMOS transistor 160 can be formed at the same time of the same dielectric material on the same substrate.

Field oxide 15 on the side of silicon slab 1182 and field oxide 15, which surrounds the silicon body 161 of CMOS transistor 160, can be formed at the same time from the same dielectric material on the same substrate.

Dielectric layer 6 of active waveguide 1180 and gate oxide 6 of CMOS transistor 160 can be formed at the same time of the same dielectric material on the same substrate, during the fabrication of a monolithic CMOS integrated circuit.

Polysilicon strip 9 of active waveguide 1180 and polysilicon gate 9 of CMOS transistor 160 can be formed at the same time of the same dielectric material on the same substrate, during the fabrication of a monolithic CMOS integrated circuit.

Sidewall passivation layers 7 of active waveguide 1180 and sidewall passivation layers 7 of CMOS transistor 160 can be formed at the same time from the same dielectric material on the same substrate.

Dielectric layers 8 of active waveguide 1180 and dielectric layers 8 of CMOS transistor 160 can be formed at the same time from the same dielectric material on the same substrate.

If silicon slab 1182 of active waveguide 1180 is to receive a well implant that is N doped, then it and a N doped well implant for the silicon body 161 of a PFET CMOS transistor 160 can be formed at the same time using the same doping material on the same substrate.

If silicon slab 1182 of active waveguide 1180 is to receive a well implant that is P doped, then it and a P doped well implant for the silicon body 161 of an NFET CMOS transistor 160 can be formed at the same time using the same doping material on the same substrate.

If they are of the same polarity, extension implant 16A of active waveguide 1180 and extension implants 16 of CMOS transistor 160 can be formed at the same time from the same doping material on the same substrate.

If they are of the same polarity, extension implant 16B of active waveguide 1180 and extension implants 16 of CMOS transistor 160 can be formed at the same time from the same doping material on the same substrate.

If they are of the same polarity, source implant 17A of active waveguide 1180 and source, drain and gate implants 17 of CMOS transistor 160 can be formed at the same time from the same doping material on the same substrate.

If they are of the same polarity, drain implant 17B of active waveguide 1180 and source, drain and gate implants 17 of CMOS transistor 160 can be formed at the same time from the same doping material on the same substrate.

Ohmic contacts 18 of active waveguide 1180 and ohmic contacts 18 of CMOS transistor 160 can be formed at the same time from the same material on the same substrate.

Conductive plugs 19 of active waveguide 1180 and conductive plugs 19 of CMOS transistor 160 can be formed at the same time from the same material on the same substrate.

Dielectric layers 2, 3, 4 and 5 used to form the cladding for active waveguide 1180 and dielectric layers 2, 3, 4 and 5 of CMOS transistor 160 can be formed at the same time of the same dielectric material on the same substrate.

In alternate embodiments of the present invention, active waveguide 1180 is fabricated without dielectric layer 6, where the polysilicon strip 9 is disposed on top of silicon slab 1182.

One particularly advantageous aspect of the present invention is the use of salicide blocking layer 3, which is part of the standard CMOS process, as an element of the cladding for active waveguide 1180. Salicide blocking layer 3 is an essential layer in the CMOS process of forming the ohmic contacts needed to make electrical connections to CMOS transistor 160. Salicide blocking layer 3 prevents the deposition of cobalt silicide in any part of a CMOS integrated circuit, where it is not needed. If cobalt silicide is deposited into the core 1181 of optical waveguide 1180, light will not be able to pass through that section of the waveguide. Thus, salicide blocking layer 3 is essential to protecting the core 1181 of optical waveguide 1180 from the light blocking deposition of metallic cobalt silicide.

A particularly advantageous aspect of the present invention is the fabrication of the elements of active waveguide 1180 and the elements of CMOS transistor 160 at the same time and using the same materials on the same substrate, during standard CMOS processing steps.

Figure 12:
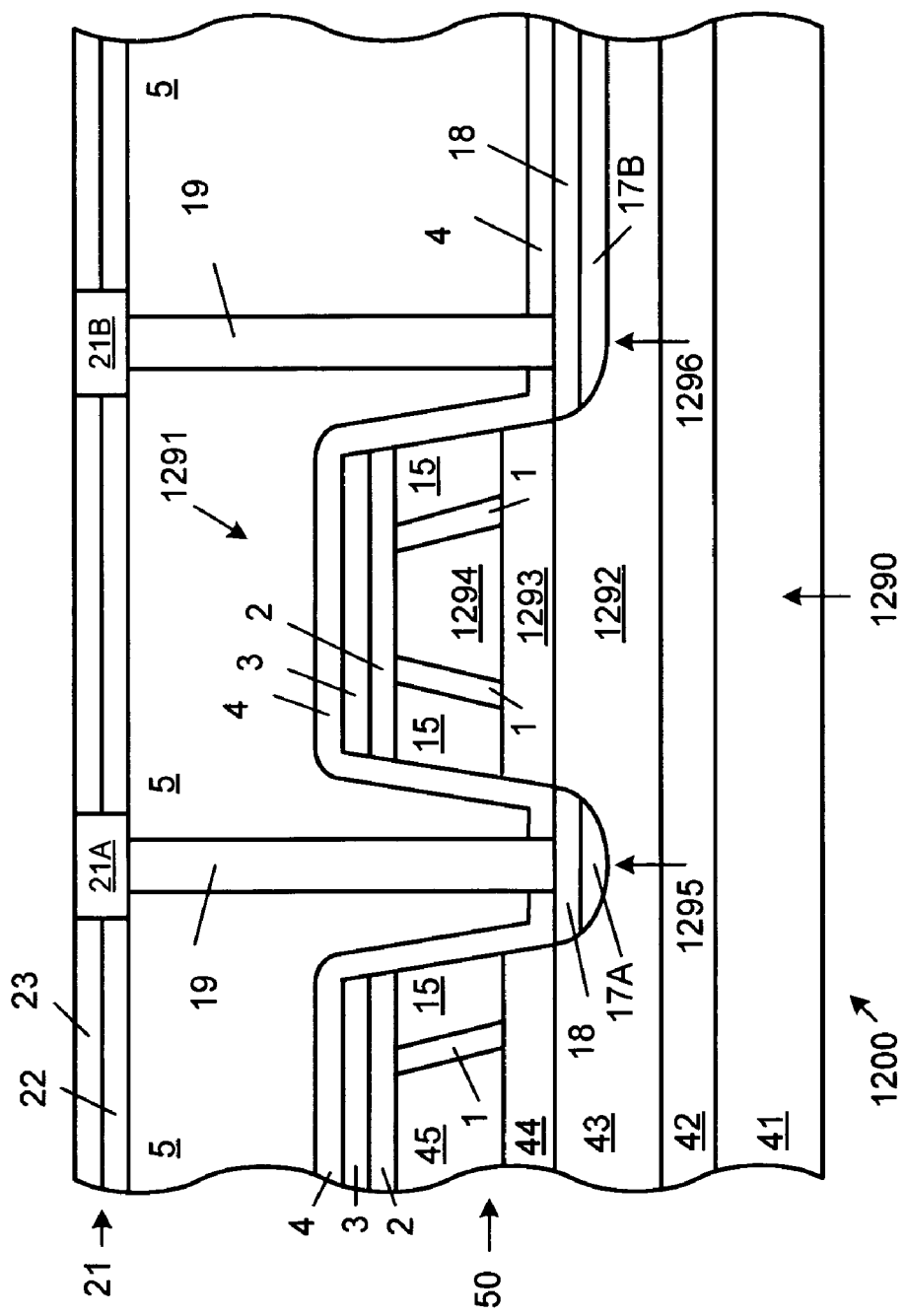
FIG. 12 is a cross sectional view of an active waveguide, according to another embodiment of the present invention.

FIG. 12 is a cross sectional view of active waveguide 1290, according to another embodiment of the present invention. Active waveguide 1290 and the CMOS transistor 160 are part of integrated circuit 1200, which has been fabricated on substrate 50. Substrate 50 is made of dielectric layer 44, which is typically made of silicon dioxide, silicon layer 43, silicon dioxide layer 42 and silicon layer 41. On top of silicon dioxide layer 44 is silicon layer 45. Layers 45, 44, 43, 42 and 41 together form a wafer, and integrated optical and electronic devices can be formed on such a wafer using standard CMOS processes.

Waveguide 1290 is made of core 1291 and surrounding layers of cladding. Core 1291 is made of silicon slab 1292, dielectric layer 1293 and silicon strip 1294. Silicon dioxide layer 42 functions as a bottom cladding for core 1291. Surrounding silicon strip 1294 on both sides of it are sidewall passivation layers 1 and sections of field oxide 15, which serve as cladding. Sidewall passivation layers 1 and field oxide sections 15 are made of dielectric material, typically silicon dioxide. Sidewall passivation can be formed by the thermal oxidation of silicon. Dielectric layer 1293 is typically made of silicon dioxide. Silicon strip 1294 in a cross sectional view can have one of many possible shapes, such as those of a square, a rectangle, a trapezoid or other form.

On top of core 1291 are dielectric layers 2, 3, 4 and 5, which function as cladding. Layer 2 is an oxide spacer layer of dielectric material, typically silicon dioxide. Layer 3 is a salicide blocking layer of dielectric material, typically silicon nitride. Layer 4 is a contact punch-through layer of dielectric material, which can be deposited from a mixture of silicon, oxygen and nitrogen. Layer 5 is an inter-level dielectric (ILD), which can be made of multiple layers of dielectric material. An ILD like layer 5 can be made of silicon dioxide, but preferably of a low k dielectric, such as silicon carbon oxide.

Active waveguide 1290, as an electronic device, operates as a PIN diode. Silicon slab 1292 includes a well implant, which can be positively or negatively doped. In alternate embodiments, silicon slab 1292 does not include a well implant.

Silicon slab 1292 includes doped region 1295 and oppositely doped region 1296, so if region 1295 is P doped, then region 1296 is N doped. Into region 1295 are placed source implant 17A. Into region 1296 are placed drain implant 17B. Implant 17A is oppositely doped to implant 17B.

Ohmic contacts 18, typically of cobalt silicide, are made into doped regions 1295 and 1296 of active waveguide 1290.

After the ohmic contacts 18 have been formed, layers 4 and 5 can be deposited. Coming through layers 4 and 5 are conductive plugs 19, typically made of tungsten, which connect ohmic contacts 18 to metal segments 21A and 21B of the first metal layer 21.

First metal layer 21 (M1) is typically made of copper and connects to conductive plugs 19 from active waveguide 1290 and provides electrical connections to other circuits on integrated circuit 1200.

Integrated circuits typically have more than one metal layer, but for purposes of simplifying the diagram, no other metal layers are shown in FIG. 12.

Active waveguide 1290 can operate as various types of optoelectronic devices, depending on how it is designed and configured, including such devices as a waveguide phase shifter or an attenuator, and such operation is well known to those skilled in the art.

Active waveguide 1290 can operate as a waveguide phase shifter by forward biasing the PIN diode within it using metal connections 21A and 21B. A voltage applied across active waveguide 1290 can change the free carrier density in silicon core 1291, which can alter the refractive index within the core 1291. Altering the refractive index as light propagates through active waveguide 1290, can cause a phase shift and/or attenuation in the light. An active waveguide 1290 can be designed so that varying the voltage across the PIN diode will primarily change the amount of phase shift in light propagating through the device. Active waveguide 1290 operating as a waveguide phase shifter can be used as part of a Mach-Zehnder interferometer functioning as a light modulator.

In alternate embodiments, implants 17A and 17B can be of the same polarity, either positively or negatively charged. When the implants are all charged with the same polarity, then active waveguide 1290, as an electronic device, operates as a CMOS resistor. If active waveguide 1290 is fabricated as a resistor and a variable voltage is applied across the device, then the free carrier density in core 1291 is altered, which can change the refractive index within the core 1291. Altering the refractive index as light propagates through active waveguide 1290, can cause a phase shift and/or attenuation in the light. An active waveguide 1290 can be designed so that varying the voltage across the PIN diode will primarily change the amount of attenuation in the light propagating through the device.

An active waveguide operating as a variable attenuator can function as an adjustable loss element, and such a device is sometimes referred to as a VOA or Viable Optical Attenuator.

Many parts or elements of active waveguide 1290 and the CMOS transistor 160 are made of the same materials and can be made at the same time during the fabrication of a monolithic CMOS integrated circuit.

FIG. 12A is a table summarizing the elements of the active waveguide 1290 of FIG. 12 and the CMOS transistor 160, which are formed from the same materials at the same time on the same substrate.

Silicon layer 45 is used to form silicon strip 1294 of active waveguide 1290 and the silicon body 161 of CMOS transistor 160. These silicon elements can be formed of the same material at the same time during the fabrication of a monolithic CMOS integrated circuit.

Dielectric layer 44 is used to form the dielectric layer 1293 of active waveguide 1290 and the dielectric layer 44 under silicon body 161 of CMOS transistor 160. These dielectric materials can be formed of the same material at the same time during the fabrication of a monolithic CMOS integrated circuit.

Sidewall passivation layers 1 of silicon strip 1294 of active waveguide 1290 and sidewall passivation layers 1 of CMOS transistor 160 can be formed at the same time of the same dielectric material on the same substrate.

Field oxide 15 on the sides of silicon strip 1294 and the field oxide 15, which surrounds the silicon body 161 of the CMOS transistor 160, can be formed at the same time from the same dielectric material on the same substrate.

If silicon slab 1292 of active waveguide 1290 is to receive a well implant that is N doped, then it and a N doped well implant for the silicon body 161 of a PFET CMOS transistor 160 can be formed at the same time using the same doping material on the same substrate.

If silicon slab 1292 of active waveguide 1290 is to receive a well implant that is P doped, then it and a P doped well implant for the silicon body 161 of an NFET CMOS transistor 160 can be formed at the same time using the same doping material on the same substrate.

If they are of the same polarity, source implant 17A of active waveguide 1290 and source, drain and gate implants 17 of CMOS transistor 160 can be formed at the same time from the same doping material on the same substrate.

If they are of the same polarity, drain implant 17B of active waveguide 1290 and source, drain and gate implants 17 of CMOS transistor 160 can be formed at the same time from the same doping material on the same substrate.

Ohmic contacts 18 of active waveguide 1290 and ohmic contacts 18 of CMOS transistor 160 can be formed at the same time from the same material on the same substrate.

Conductive plugs 19 of active waveguide 1290 and conductive plugs 19 of CMOS transistor 160 can be formed at the same time from the same material on the same substrate.

Dielectric layers 2, 3, 4 and 5 used to form the cladding for active waveguide 1290 and dielectric layers 2, 3, 4 and 5 of CMOS transistor 160 can be formed at the same time of the same dielectric material on the same substrate.

A particularly advantageous aspect of the present invention is the fabrication of the elements of active waveguide 1290 and the elements of a CMOS transistor 160 at the same time using the same materials on the same substrate, during standard CMOS processing steps.

One particularly advantageous aspect of the present invention is the use of salicide blocking layer 3, which is part of the standard CMOS process, as an element of the cladding for active waveguide 1290. Salicide blocking layer 3 is an essential layer in the CMOS process of forming the ohmic contacts needed to make electrical connections to the CMOS transistor 160. Salicide blocking layer 3 prevents the deposition of cobalt silicide in any part of a CMOS integrated circuit, where it is not needed. If cobalt silicide is deposited into the core of optical waveguide 1290, light will not be able to pass through that section of the waveguide. Thus, salicide blocking layer 3 is essential to protecting the core 1291 of optical waveguide 1290 from the light blocking deposition of metallic cobalt silicide.

Figure 13:
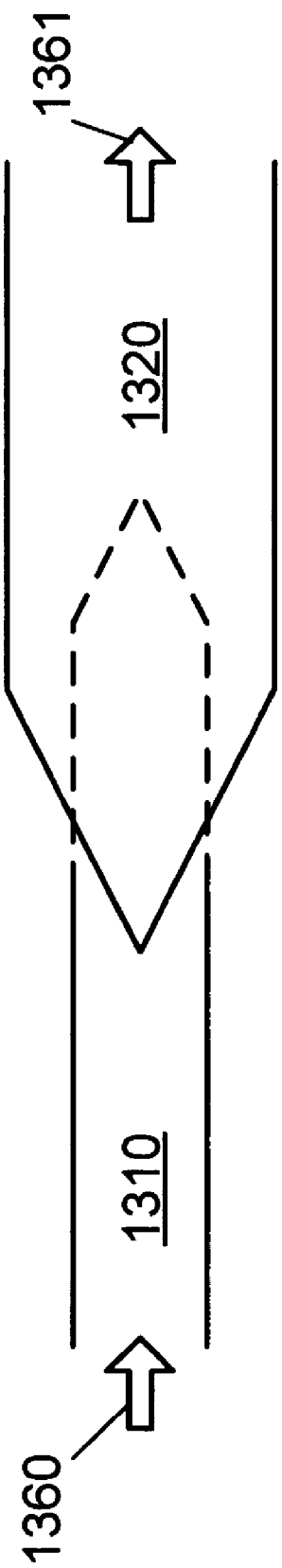
FIG. 13 is a top view of a waveguide to waveguide coupler, according to an embodiment of the present invention.

FIG. 13 is a top view, not to scale, of waveguide coupler 1300, according to an embodiment of the present invention. FIG. 13 is a simplified view of waveguide coupler 1300. The various layers of cladding are not shown in FIG. 13. Waveguide core 1320 is disposed on top of waveguide core 1310. The shaped end of waveguide core 1310 can direct some of the light 1360 traveling in core 1310 upward into core 1320. Similarly, the shaped end of waveguide core 1320 can direct some of the light traveling upward from core 1310 sideways into core 1320 as light 1361. Light can travel from left to right, as shown in FIG. 13 or from right to left through coupling 1300. Core 1310 can be made of monocrystalline silicon and core 1320 can be made of polysilicon. The shaped ends of cores 1310 and 1320 can have any of a variety of regular or irregular shapes. Core 1320 is fully supported along its length by dielectric material, such as field oxide, except where it is on top of silicon core 1310. The width of core 1310 as compared to the width of core 1320 can be either wider or narrower, depending on the design for a particular application.

In alternate embodiments, core 1310 does not have a shaped end, but continues under core 1320 to form a polysilicon strip loaded silicon waveguide. Core 1310 can also widen as it continues under the polysilicon strip.

Figure 14:
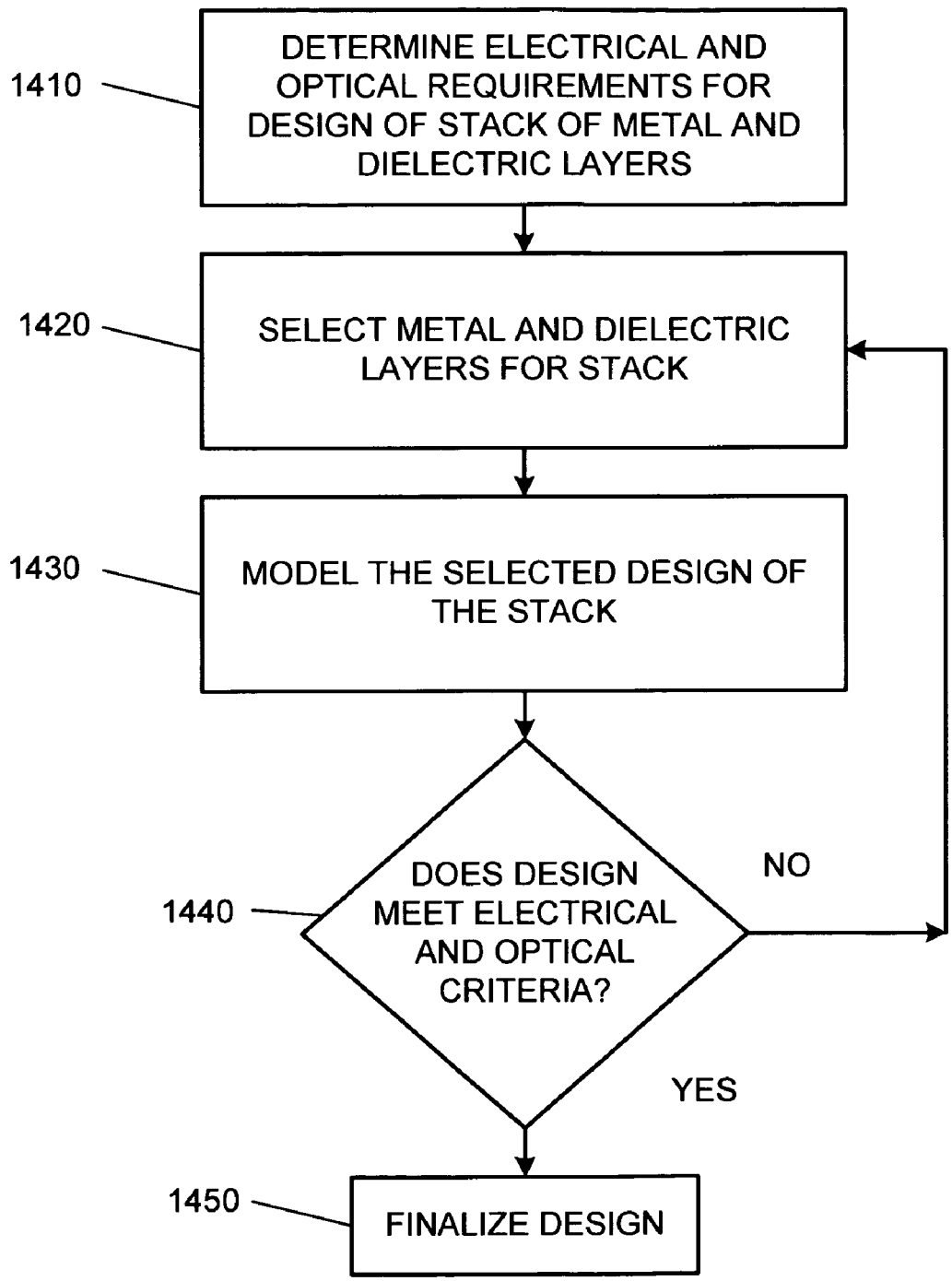
FIG. 14 is a block diagram summarizing the process of designing a metal and dielectric stack for an optoelectronic integrated circuit.

FIG. 14 is a block diagram summarizing the process of designing a metal and dielectric stack for an optoelectronic integrated circuit. The process of fabricating an integrated circuit encompasses many steps and diverse materials. The process steps and materials have to be selected in order to make a specific integrated circuit, which will meet its design specifications. The selection of fabrication materials and steps for electronic integrated circuits requires considerable expertise and skill, but has been done for several decades and as a result, is well known to those skilled in the art.

The selection of fabrication materials and process steps for optoelectronic integrated circuits is a relatively new field and many aspects of this process are either not well known or have yet to be discovered. Integrated optoelectronic circuits typically have some combination of optical, electronic and optoelectronic devices and components. CMOS integrated circuits are typically made of many layers, primarily consisting of devices and components made within the top silicon layer and many layers on top of the active silicon layer. The layers on top of the silicon layer typically include several metal layers and many layers of dielectric materials.

One of the design requirements for optoelectronic circuits which couple light through the top surface of a chip, such as the devices shown in FIGS. 4 to 10 herein, is to optically design the stack of metal and dielectric layers. Metal layers can extend into the area of a stack on a chip, where light must pass through the stack. The design of such a stack in an optoelectronic circuit has to be optimized to maximize the transmission of light through the stack and to minimize the generation of reflections by the layers in the stack.

FIG. 14 is a summary in block diagram form of an embodiment of the design process for a metal and dielectric stack. In block 1410, the electrical and optical requirements for the design of a stack of metal and dielectric layers are determined. In block 1420, the metal and dielectric layers for a stack are selected. In block 1430, the selected stack is modeled as a unit. In block 1440, the results of the modeling process in block 1430 are compared to the electrical and optical requirements determined in block 1410.

If the model does not meet the criteria determined in block 1410, then flow returns to block 1420 to reselect the stack of metal and dielectric layers and flow proceeds to block 1430 and 1440, as discussed above.

If the model does meet the criteria established in block 1410, then flow proceeds to block 1450, where this part of the design of an integrated circuit is finalized.

The design and layout of integrated electronic circuits is well known to those skilled in the art. The foundries fabricating integrated circuits have design rules, which the layout of an integrated circuit must satisfy. A well known design rule is the specification of the minimum feature size that can be reliably fabricated in a particular process. The minimum line width at many foundries at the current time is 0.13 microns. As new processes are developed in the never ending quest to pack more and more transistors of a smaller size onto a chip, the minimum feature size shrinks to a size smaller than what was available.

The design and layout of nanophotonic integrated circuits is involved with the layout of optoelectronic devices that are smaller than the minimum feature size for a particular process such as CMOS. One aspect of the present invention is the design of optoelectronic elements and devices, with dimensions smaller than the minimum feature size of a process.

Another well known design rule for integrated circuits is the layout of all electronic elements and devices on an x-y orthogonal grid. Typically, all the electronic elements and devices on electronic chips today have square or rectangular shapes. Standard chip layout rules all assume the use of straight lines and sharp right angle bends and the rules do not anticipate the need for curved lines or non-orthogonal bends or intersections.

The design and layout of nanophotonic circuits frequently requires the specification of curved shapes and features. Another aspect of the present invention is the design of optoelectronic elements and devices, with non-orthogonal bends, intersections and curved geometric features, which are not part of the process design rules established for electronic elements and devices.

A particularly advantageous aspect of the present invention is the fabrication of the elements of optoelectronic devices and the elements of a CMOS transistor at the same time and using the same materials on the same substrate, using standard CMOS processing steps.

In alternate embodiments of the present invention, optoelectronic devices and integrated electronic devices, such as bipolar junction transistors (BJTs) and junction field effect transistors (JFETs) can be formed on the same substrate, using standard foundry processing steps.

Although the present invention has been described in detail, it should be understood that various changes, substitutions and alterations can be made without departing from the spirit and scope of the invention as defined herein. The embodiments described above are to be considered in all respects as illustrative only and not restrictive in any manner.

We claim:

1. A light scattering element for an optical waveguide with a core,
    where the core of the optical waveguide is comprised of:
        a slab of monocrystalline silicon,
        a first layer of dielectric material disposed on the slab of monocrystalline silicon, and
        a strip of monocrystalline silicon disposed on the first layer of dielectric material,
        where the strip and a silicon body of a transistor are formed from the same monocrystalline silicon on the same substrate, and
    the light scattering element is comprised of:
        a second layer of dielectric material disposed on the strip of monocrystalline silicon,
        where the second layer of dielectric material and a gate oxide for a transistor are formed at the same time of the same dielectric material,
        a layer of polysilicon disposed on the second layer of dielectric material,
        where the layer of polysilicon and a polysilicon gate for a transistor are formed at the same time from the same polysilicon, and
        a cladding comprised of a plurality of dielectric materials,
        where the cladding is disposed over:
            the core of the waveguide,
            the second layer of dielectric materials and
            the layer of polysilicon, and
            at least one of the plurality of dielectric materials is comprised of a layer of salicide block used during the fabrication of a transistor.

2. The optical waveguide of claim 1, wherein the substrate is comprised of a layer of silicon dioxide disposed on a layer of monocrystalline silicon.

3. The optical waveguide of claim 2, wherein
    the substrate,
    the slab of monocrystalline silicon disposed on the substrate,
    the first layer of dielectric material disposed on the slab of monocrystalline silicon and
    a layer of monocrystalline silicon disposed on the layer of dielectric material, where the strip of monocrystalline silicon is formed from the layer of monocrystalline silicon,
    comprises a wafer.

4. The optical waveguide of claim 1, wherein the first layer of dielectric material is comprised of silicon dioxide and is used to electrically isolate the transistor from the slab of monocrystalline silicon.

5. The light scattering element of claim 1, wherein the cladding includes a bottom cladding comprised of the top layer of the substrate.

6. The light scattering element of claim 1, wherein the cladding includes a layer of dielectric material formed at the same time as the sidewall passivation for the silicon body of a transistor.

7. The light scattering element of claim 1, wherein the cladding includes a plurality of layers of dielectric material formed at the same time as a plurality of dielectric materials used as a gate spacer for a transistor.

8. The light scattering element of claim 1, wherein the cladding includes a layer of dielectric material formed at the same time as a contact punch-through layer for a transistor.

9. The light scattering element of claim 1, wherein the cladding includes a layer of dielectric material formed at the same time as an inter-level dielectric for a transistor.

10. The light scattering element of claims 6, 7, 8 or 9, wherein the layer of dielectric material included in the cladding is selected from the group comprising: silicon dioxide, silicon oxynitride and silicon nitride.

11. The light scattering element of claim 1, wherein at least one of the plurality of dielectric materials is selected from a group of dielectrics used at the same time to form a dielectric element of a transistor, where the group of dielectrics comprises: a contact punch-through layer, an inter-layer dielectric film, a gate spacer, a salicide block, a dielectric spacer, a sidewall passivation film, an isolation dielectric, an oxide spacer and a field oxide.

12. The optical waveguide of claim 11, wherein thermal oxidation is used to form a sidewall passivation film, where the sidewall passivation film is used as one of a plurality of dielectric materials for the optical waveguide and is formed at the same time as the sidewall passivation film for the body of a transistor.

13. The light scattering element of claim 1, wherein at least one of the plurality of dielectric materials is selected from the group comprising: $SiO_2$, SiCOH, SiCOF, $Si_3N_4$, SiON, BPSG and silicon-based materials including one or more of the following elements: oxygen, carbon, nitrogen, hydrogen, boron, phosphorus, fluorine and arsenic.

14. The light scattering element of claim 1, wherein the transistor is selected from the group comprising: a CMOS transistor, a BiCMOS transistor, a bipolar junction transistor (BJT) and a junction FET (JFET) transistor.

15. The light scattering element of claim 1, wherein the salicide block layer is used as a gate spacer during the fabrication of a transistor on the same substrate.

* * * * *